United States Patent
Chen et al.

(10) Patent No.: US 10,903,260 B2
(45) Date of Patent: Jan. 26, 2021

(54) MULTI-PHOTODIODE PIXEL CELL

(71) Applicant: Facebook Technologies, LLC, Menlo Park, CA (US)

(72) Inventors: Song Chen, Redmond, WA (US); Xinqiao Liu, Medina, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/435,449

(22) Filed: Jun. 7, 2019

(65) Prior Publication Data
US 2019/0378872 A1 Dec. 12, 2019

Related U.S. Application Data

(60) Provisional application No. 62/683,599, filed on Jun. 11, 2018.

(51) Int. Cl.
*H01L 27/146* (2006.01)
*H01L 27/148* (2006.01)

(52) U.S. Cl.
CPC .. *H01L 27/14649* (2013.01); *H01L 27/14645* (2013.01); *H01L 27/14806* (2013.01)

(58) Field of Classification Search
CPC ......... H01L 27/14649; H01L 27/14806; H01L 27/14645; H01L 27/14672;
(Continued)

(56) References Cited

U.S. PATENT DOCUMENTS

| 4,596,977 A | 6/1986 | Bauman et al. |
| 6,529,241 B1 | 3/2003 | Clark |

(Continued)

FOREIGN PATENT DOCUMENTS

| EP | 1732134 A1 | 12/2006 |
| EP | 1746820 A1 | 1/2007 |

(Continued)

OTHER PUBLICATIONS

U.S. Appl. No. 16/431,693, "Non-Final Office Action", dated Jan. 30, 2020, 6 pages.
(Continued)

*Primary Examiner* — Marcus H Taningco
(74) *Attorney, Agent, or Firm* — Kilpatrick Townsend & Stockton

(57) ABSTRACT

In one example, an apparatus comprises: a semiconductor substrate including a front side surface, a first photodiode to generate a first charge, a second photodiode to generate a second charge, a barrier layer between the first photodiode and the second photodiode and configured to control flow of the second charge from the second photodiode to the first photodiode, and a drain region to store the first charge and at least a first part of the second charge. The apparatus further comprises a gate on the front side surface over a first channel region between the first photodiode and the drain region to control the flow of the first charge and the at least the first part of the second charge to the drain region, and a second channel region to conduct at least a second part of the second charge away from the barrier layer when the second photodiode saturates.

20 Claims, 31 Drawing Sheets

(58) Field of Classification Search
CPC ........... H01L 27/14647; H01L 27/1461; H01L 27/14616; H01L 27/14638
See application file for complete search history.

(56) References Cited

U.S. PATENT DOCUMENTS

| | | |
|---|---|---|
| 8,144,227 B2 | 3/2012 | Kobayashi |
| 8,754,798 B2 | 6/2014 | Lin |
| 8,773,562 B1 | 7/2014 | Fan |
| 8,946,610 B2 | 2/2015 | Iwabuchi et al. |
| 9,343,497 B2 | 5/2016 | Cho |
| 9,478,579 B2 | 10/2016 | Dai et al. |
| 9,967,496 B2 | 5/2018 | Ayers et al. |
| 10,003,759 B2 | 6/2018 | Fan |
| 10,015,416 B2 | 7/2018 | Borthakur et al. |
| 2003/0049925 A1 | 3/2003 | Layman et al. |
| 2004/0095495 A1 | 5/2004 | Inokuma et al. |
| 2004/0251483 A1 | 12/2004 | Ko et al. |
| 2005/0280727 A1 | 12/2005 | Sato et al. |
| 2006/0023109 A1 | 2/2006 | Mabuchi et al. |
| 2007/0092244 A1 | 4/2007 | Pertsel et al. |
| 2008/0088014 A1 | 4/2008 | Adkisson et al. |
| 2008/0226183 A1 | 9/2008 | Lei et al. |
| 2009/0002528 A1 | 1/2009 | Manabe et al. |
| 2009/0091645 A1 | 4/2009 | Trimeche et al. |
| 2009/0128640 A1 | 5/2009 | Yumiki |
| 2009/0224139 A1 | 9/2009 | Buettgen et al. |
| 2009/0261235 A1 | 10/2009 | Lahav et al. |
| 2010/0276572 A1 | 11/2010 | Iwabuchi et al. |
| 2011/0049589 A1 | 3/2011 | Chuang et al. |
| 2011/0149116 A1 | 6/2011 | Kim |
| 2012/0039548 A1 | 2/2012 | Wang et al. |
| 2012/0092677 A1 | 4/2012 | Suehira et al. |
| 2012/0273654 A1 | 11/2012 | Hynecek et al. |
| 2013/0020466 A1 | 1/2013 | Ayers et al. |
| 2013/0082313 A1 | 4/2013 | Manabe |
| 2013/0113969 A1* | 5/2013 | Manabe ............ H01L 27/14616 348/308 |
| 2013/0126710 A1 | 5/2013 | Kondo |
| 2013/0234029 A1 | 9/2013 | Bikumandla |
| 2013/0293752 A1 | 11/2013 | Peng et al. |
| 2014/0042582 A1 | 2/2014 | Kondo |
| 2014/0085523 A1 | 3/2014 | Hynecek |
| 2014/0176770 A1 | 6/2014 | Kondo |
| 2014/0211052 A1 | 7/2014 | Choi |
| 2014/0306276 A1 | 10/2014 | Yamaguchi |
| 2015/0083895 A1 | 3/2015 | Hashimoto et al. |
| 2015/0090863 A1 | 4/2015 | Mansoorian et al. |
| 2015/0172574 A1 | 6/2015 | Honda et al. |
| 2015/0350582 A1* | 12/2015 | Korobov ............ H04N 5/37452 348/302 |
| 2015/0358593 A1 | 12/2015 | Sato |
| 2015/0381907 A1 | 12/2015 | Boettiger et al. |
| 2016/0037111 A1 | 2/2016 | Dai et al. |
| 2016/0240570 A1* | 8/2016 | Barna ............... H01L 27/14621 |
| 2016/0337605 A1 | 11/2016 | Ito |
| 2016/0353045 A1 | 12/2016 | Kawahito et al. |
| 2017/0013215 A1* | 1/2017 | McCarten ............ H04N 5/3728 |
| 2017/0053962 A1 | 2/2017 | Oh et al. |
| 2017/0062501 A1 | 3/2017 | Velichko et al. |
| 2017/0104021 A1 | 4/2017 | Park et al. |
| 2017/0104946 A1 | 4/2017 | Hong |
| 2017/0170223 A1 | 6/2017 | Hynecek et al. |
| 2017/0207268 A1 | 7/2017 | Kurokawa |
| 2017/0366766 A1 | 12/2017 | Geurts et al. |
| 2018/0019269 A1* | 1/2018 | Klipstein .......... H01L 27/14647 |
| 2018/0152650 A1 | 5/2018 | Sakakibara et al. |
| 2019/0052788 A1 | 2/2019 | Liu |
| 2019/0056264 A1 | 2/2019 | Liu |
| 2019/0057995 A1 | 2/2019 | Liu |
| 2019/0058058 A1 | 2/2019 | Liu |
| 2019/0172868 A1 | 6/2019 | Chen et al. |
| 2019/0348460 A1 | 11/2019 | Chen et al. |
| 2019/0371845 A1 | 12/2019 | Chen et al. |
| 2019/0379827 A1 | 12/2019 | Berkovich et al. |
| 2020/0007800 A1 | 1/2020 | Berkovich et al. |
| 2020/0068189 A1 | 2/2020 | Chen et al. |

FOREIGN PATENT DOCUMENTS

| | | |
|---|---|---|
| EP | 2063630 A1 | 5/2009 |
| EP | 2538664 A2 | 12/2012 |
| EP | 2833619 A1 | 2/2015 |
| EP | 3425352 A1 | 1/2019 |
| KR | 20110050351 A | 5/2011 |
| WO | 2017069706 A1 | 4/2017 |
| WO | 2017169882 A1 | 10/2017 |
| WO | 2019168929 A1 | 9/2019 |

OTHER PUBLICATIONS

U.S. Appl. No. 16/436,049, "Non-Final Office Action", dated Mar. 4, 2020, 9 pages.
U.S. Appl. No. 15/801,216, "Advisory Action", dated Apr. 7, 2020, 3 pages.
U.S. Appl. No. 15/801,216, "Final Office Action", dated Dec. 26, 2019, 5 pages.
U.S. Appl. No. 15/801,216, "Non-Final Office Action", dated Jun. 27, 2019, 13 pages.
U.S. Appl. No. 15/801,216, "Notice of Allowance", dated Jun. 23, 2020, 5 pages.
U.S. Appl. No. 15/876,061, "Corrected Notice of Allowability", dated Apr. 28, 2020, 3 pages.
U.S. Appl. No. 15/876,061, "Non-Final Office Action", dated Sep. 18, 2019, 23 pages.
U.S. Appl. No. 15/876,061, "Notice of Allowability", dated May 6, 2020, 2 pages.
U.S. Appl. No. 15/876,061, "Notice of Allowance", dated Feb. 4, 2020, 13 pages.
U.S. Appl. No. 15/983,391, "Non-Final Office Action", dated Aug. 29, 2019, 12 pages.
U.S. Appl. No. 15/983,391, "Notice of Allowance", dated Apr. 8, 2020, 8 pages.
U.S. Appl. No. 16/210,748, "Final Office Action", dated Jul. 7, 2020, 11 pages.
U.S. Appl. No. 16/210,748, "Non-Final Office Action", dated Jan. 31, 2020, 11 pages.
U.S. Appl. No. 16/384,720, "Non-Final Office Action", dated May 1, 2020, 6 pages.
U.S. Appl. No. 16/436,049, "Non-Final Office Action", dated Jun. 30, 2020, 11 pages.
U.S. Appl. No. 16/454,787, "Notice of Allowance", dated Apr. 22, 2020, 10 pages.
U.S. Appl. No. 16/454,787, "Notice of Allowance", dated Jul. 9, 2020, 9 pages.
EP18188684.7, "Extended European Search Report", dated Jan. 16, 2019, 10 pages.
EP18188684.7, "Office Action", dated Nov. 26, 2019, 9 pages.
EP18188962.7, "Extended European Search Report", dated Oct. 23, 2018, 8 pages.
EP18188962.7, "Office Action", dated Aug. 28, 2019, 6 pages.
PCT/US2018/045666, "International Preliminary Report on Patentability", dated Feb. 27, 2020, 11 pages.
PCT/US2018/045666, "International Search Report and Written Opinion", dated Dec. 3, 2018, 13 pages.
PCT/US2018/045673, "International Search Report and Written Opinion", dated Dec. 4, 2018, 13 pages.
PCT/US2019/031521, "International Search Report and Written Opinion", dated Jul. 11, 2019, 11 pages.
PCT/US2019/036492, "International Search Report and Written Opinion", dated Sep. 25, 2019, 9 pages.
PCT/US2019/036536, "International Search Report and Written Opinion", dated Sep. 26, 2019, 14 pages.
PCT/US2019/039410, "International Search Report and Written Opinion", dated Sep. 30, 2019, 11 pages.
PCT/US2019/039758, "International Search Report and Written Opinion", dated Oct. 11, 2019, 13 pages.

(56) References Cited

OTHER PUBLICATIONS

PCT/US2019/047156, "International Search Report and Written Opinion", dated Oct. 23, 2019, 9 pages.
PCT/US2019/048241, "International Search Report and Written Opinion", dated Jan. 28, 2020, 16 pages.
PCT/US2019/049756, "International Search Report and Written Opinion", dated Dec. 16, 2019, 8 pages.
PCT/US2019/059754, "International Search Report and Written Opinion", dated Mar. 24, 2020, 15 pages.
Snoeij, "A Low Power Column-Parallel 12-Bit ADC for CMOS Imagers", Institute of Electrical and Electronics Engineers Workshop on Charge-Coupled Devices and Advanced Image Sensors, Jun. 2005, pp. 169-172.
U.S. Appl. No. 16/384,720, "Notice of Allowance", dated Aug. 26, 2020, 8 pages.

\* cited by examiner

MULTI-PHOTODIODE PIXEL CELL

RELATED APPLICATIONS

This patent application claims priority to U.S. Provisional Patent Application Ser. No. 62/683,599, filed Jun. 11, 2018, entitled "PIXEL WITH STACKED DUAL PHOTODIODES AND ANTI-BLOOMING CHANNEL," which is assigned to the assignee hereof and is incorporated herein by reference in its entirety for all purposes.

BACKGROUND

The disclosure relates generally to image sensors, and more specifically to a pixel cell that includes multiple photodiodes.

A typical pixel cell in an image sensor includes a photodiode to sense incident light by converting photons into charge (e.g., electrons or holes). The charge can be temporarily stored in a photodiode during an exposure period. For improved noise and dark current performances, a pinned photodiode can be included in the pixel to convert the photons into charge. The pixel may further include a capacitor (e.g., a floating diffusion) to collect the charge from the photodiode and to convert the charge to a voltage.

An image sensor typically includes an array of pixel cells. The pixel cells may receive light of different intensities, and can generate different quantities of charge. Blooming can occur when the intensity of light received by a pixel cell is so high that the pixel cell becomes saturated and cannot store additional charge, and the additional charge leaks into adjacent pixel cells and corrupts the charge stored in the adjacent pixel cells.

SUMMARY

The present disclosure relates to image sensors. More specifically, and without limitation, this disclosure relates to an image sensor having an array of pixel cells.

In one example, an apparatus is provided. The apparatus comprises a semiconductor substrate including: a front side surface, a first photodiode to generate a first charge, a second photodiode to generate a second charge, a barrier layer between the first photodiode and the second photodiode and configured to control flow of the second charge from the second photodiode to the first photodiode, and a drain region to store the first charge and at least a first part of the second charge. The apparatus further includes a gate on the front side surface over a first channel region between the first photodiode and the drain region to control the flow of the first charge and the at least the first part of the second charge to the drain region, and a second channel region to conduct at least a second part of the second charge away from the second photodiode and the barrier layer when the second photodiode saturates.

In some aspects, the second channel region is part of the semiconductor substrate and intersects the barrier layer.

In some aspects, the second channel region connects between the second photodiode and the drain region.

In some aspects, each of the drain region and the second channel region comprises an N-type semiconductor material. The second channel region is connected to an N-type region of the second photodiode.

In some aspects, the semiconductor substrate further comprises a P-well that surrounds the N-type region of the second photodiode. The N-type second channel region is formed in the P-well.

In some aspects, a first dopant concentration of the second channel region is lower than a second dopant concentration of the N-type region of the second photodiode.

In some aspects, the drain region is a first drain region. The semiconductor substrate further comprises a second drain region. The second channel region connects between the second photodiode and the second drain region.

In some aspects, the second channel region is formed by an ion implantation process.

In some aspects, the second photodiode is sandwiched between the barrier layer and the second channel region.

In some aspects, the drain region is a first drain region. The semiconductor substrate further comprises a second drain region. The second channel region is sandwiched between the second photodiode and the second drain region.

In some aspects, the second channel region comprises an epitaxy layer formed on a back side surface of the semiconductor substrate, the back side surface being opposite to the front side surface of the semiconductor substrate.

In some aspects, the semiconductor substrate further comprises a first conductive region and a second conductive region extending from the front side surface configured to receive, respectively, a first voltage and a second voltage. The first conductive region extends from the front side surface to the second channel region and is configured to bias the second channel region at the first voltage. The second conductive region extends from the front side surface to the second drain region and is configured to bias the second drain region at the second voltage.

In some aspects, the second channel region comprises a P-type semiconductor material. The second drain region comprises an N-type semiconductor material.

In some aspects, the semiconductor substrate includes a back side surface opposite to the front side surface configured as a light receiving surface. The first photodiode is configured to convert a first component of light within an infra-red light wavelength range to the first charge. The second photodiode is configured to convert a second component of light within a visible light wavelength range to the second charge.

In some aspects, the front side surface is configured as a light receiving surface. The first photodiode is configured to convert a first component of light within a visible light wavelength range to the first charge. The second photodiode is configured to convert a second component of light within an infra-red light wavelength range to the second charge.

In some aspects, the first channel region comprises a buried layer.\

In some aspects, the apparatus further comprises a conductive deep trench isolation (C-DTI) structure that extends from the front side surface and across an N-type region of the first photodiode and the barrier layer. The C-DTI structure is configured to receive a voltage and to bias the barrier layer based on the voltage.

In some aspects, the C-DTI structure extends across the an N-type region of the second photodiode.

In some aspects, the apparatus further comprises: a back side surface opposite to the front side surface, and a CDT structure that extends from the back side surface and across an N-type region of the second photodiode and the barrier layer. The C-DTI structure is configured to receive a voltage signal and to bias the barrier layer based on the voltage signal.

In some aspects, the gate is a first gate. The apparatus further comprises a second gate that extends from the front side surface to reach the barrier layer. The second gate is configured to receive a voltage signal and to bias the barrier layer based on the voltage signal.

BRIEF DESCRIPTION OF THE DRAWINGS

Illustrative embodiments are described with reference to the following figures.

Figure 1A:
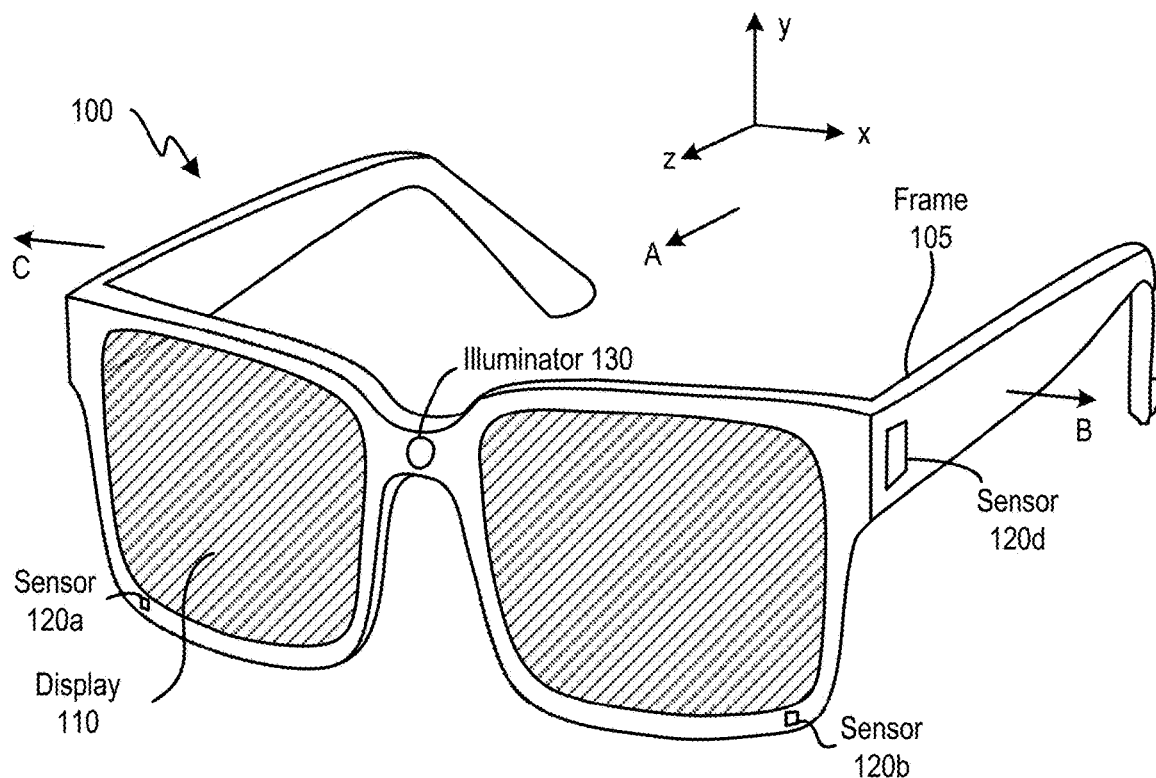
FIG. 1A and FIG. 1B are diagrams of an embodiment of a near-eye display.
Figure 1A:
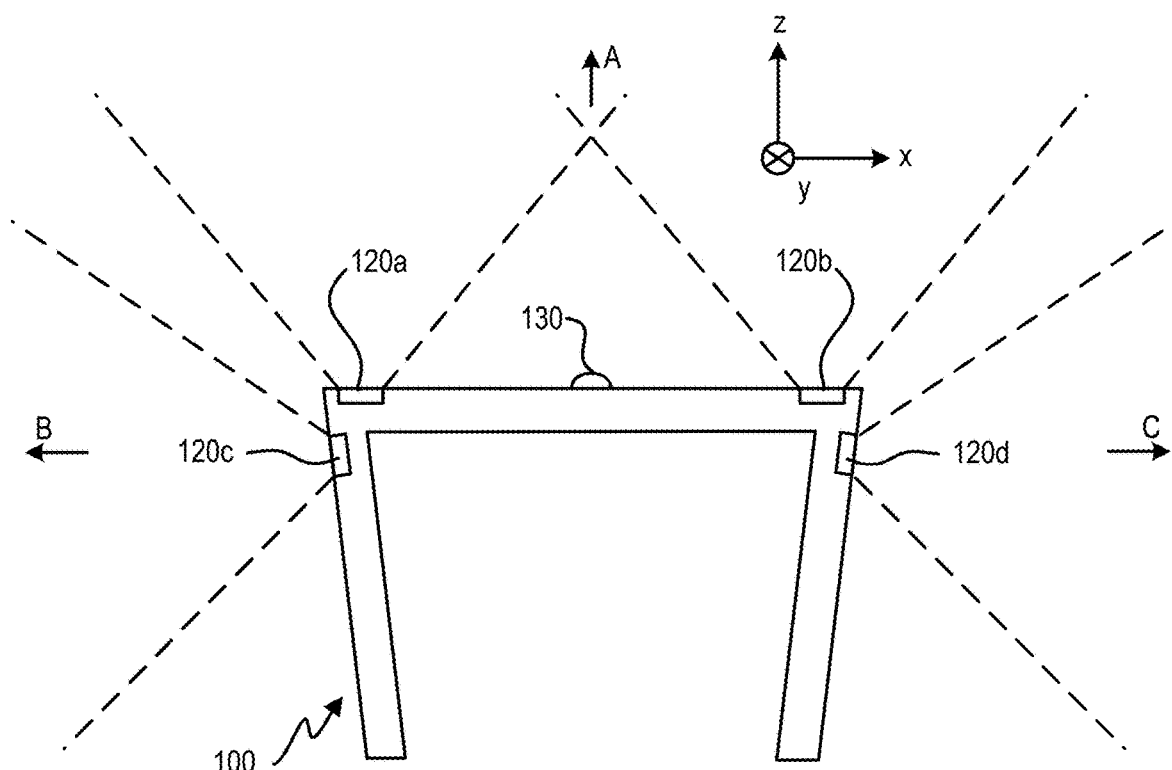

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor typically includes an array of pixel cells. Each pixel cell may have a photodiode to sense incident light by converting photons into charge (e.g., electrons or holes). For improved noise and dark current performances, a pinned photodiode can be included in the pixel to convert the photons into charge. The charge can be temporarily stored in the photodiode during an exposure period. Each pixel cell may also include a floating diffusion node to convert the charge to a voltage. A pixel value can be generated based on the voltage. The pixel value can represent an intensity of light received by the pixel cell. An image comprising an array of pixels can be derived from the digital outputs of the voltages output by an array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infra-red light) can be used for 3D sensing. An image sensor may include an optical filter array to allow visible light of different optical wavelength ranges and colors (e.g., red, green, and blue colors) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform 3D sensing, light of a different wavelength range (e.g., infra-red light) can be projected onto an object, and the reflected light can be detected by the pixel cells. The light can include structured light, light pulses, etc. The pixel cell outputs can be used to perform depth sensing operations based on, for example, detecting patterns of the reflected structured light, measuring a time-of-flight of the light pulse, etc. To detect patterns of the reflected structured light, a distribution of quantities of charge generated by the pixel cells during the exposure time can be determined, and pixel values can be generated based on the voltages corresponding to the quantities of charge. For time-of-flight measurement, the timing of generation of the charge at the photodiodes of the pixel cells can be determined to represent the times when the reflected light pulses are received at the pixel cells. Time differences between when the light pulses are projected to the object and when the reflected light pulses are received at the pixel cells can be used to provide the time-of-flight measurement.

A pixel cell array can be used to generate information of a scene. In some examples, a subset (e.g., a first set) of the pixel cells within the array can be used to perform 2D sensing of the scene, and another subset (e.g., a second set) of the pixel cells within the array can be used to perform 3D sensing of the scene. The fusion of 2D and 3D imaging data is useful for many applications that provide virtual-reality (VR), augmented-reality (AR) and/or mixed reality (MR) experiences. For example, a wearable VR/AR/MR system may perform a scene reconstruction of an environment in which the user of the system is located. Based on the reconstructed scene, the VR/AR/MR can generate display effects to provide an interactive experience. To reconstruct a scene, a subset of pixel cells within a pixel cell array can perform 3D sensing to, for example, identify a set of physical objects in the environment and determine the distances between the physical objects and the user. Another subset of pixel cells within the pixel cell array can perform 2D sensing to, for example, capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/ AR system can track a location of the identified object relative to the wearable device worn by the user. The VR/AR/AR system can track the head movement based on, for example, tracking the change in the location of the identified object relative to the wearable device as the user's head moves.

Using different sets of pixels for 2D and 3D imaging, however, can pose a number of challenges. First, because only a subset of the pixel cells of the array is used to perform either 2D imaging or 3D imaging, the spatial resolutions of both of the 2D image and 3D image are lower than the maximum spatial resolution available at the pixel cell array. Although the resolutions can be improved by including more pixel cells, such an approach can lead to increases in the form-factor of the image sensor as well as power consumption, both of which are undesirable especially for a wearable device.

Moreover, since pixel cells assigned to measure light of different wavelength ranges (for 2D and 3D imaging) are not collocated, different pixel cells may capture information of different spots of a scene, which can complicate the mapping between 2D and 3D images. For example, a pixel cell that receives a certain color component of visible light (for 2D imaging) and a pixel cell that receives invisible light (for 3D imaging) may also capture information of different spots of the scene. The output of these pixel cells cannot be simply merged to generate the 2D and 3D images. The lack of correspondence between the output of the pixel cells due to their different locations can be worsened when the pixel cell array is capturing 2D and 3D images of a moving object. While there are processing techniques available to correlate different pixel cell outputs to generate pixels for a 2D image, and to correlate between 2D and 3D images (e.g., interpolation), these techniques are typically computation-intensive and can also increase power consumption.

The present disclosure relates to an image sensor that can provide collocated 2D and 3D imaging. The image sensor includes an array of pixel cells. Each pixel cell includes a light receiving surface, as well as a first photodiode and a second photodiode forming a stack with respect to the light receiving surface. Both the first photodiode and the second photodiode receive incident light via the light receiving surface, but the incident light propagates through different distances to reach the first photodiode and the second photodiode, which enables the photodiodes to absorb and convert different wavelength components of the incident light to charge. For example, in a case where the first photodiode is further away from the light receiving surface than the second photodiode, the visible light component of the incident light can be absorbed by the first photodiode and converted to a first charge for 2D imaging, whereas the infra-red light component can propagate through a longer distance and can be absorbed and converted by the second photodiode to a second charge for 3D imaging. With such arrangements, measurements of different components of light received at the same location on the pixel array can be performed, which allows collocated 2D and 3D imaging.

The pixel cell further includes a transfer gate and a read-out drain region to read out charge from the first photodiode and from the second photodiode. The transfer gate can be formed on a front side surface which can be the light receiving surface or opposite to the light receiving surface. The read-out drain region can be formed underneath the front side surface. The transfer gate can be controlled to transfer the first charge from the first photodiode to the read-out drain region for read out. The second charge can also flow from the second photodiode to the read-out drain region through the first photodiode for read out, after the first charge has been removed from the first photodiode. The pixel cell includes a barrier layer sandwiched between the first photodiode and the second photodiode. The barrier layer can be controlled to prevent the second charge from flowing into the first photodiode before the read out of the first charge, and can be controlled to allow the second charge to flow into the first photodiode for read out, after the read out of the first charge completes.

Although a stacked photodiode structure allows collocated 2D and 3D sensing, such a structure can be susceptible to blooming. Blooming can occur when the intensity of light received by a pixel cell is so high that the pixel cell becomes saturated and cannot store additional charge, and the additional charge leaks into adjacent pixel cells and corrupt the charge stored in the adjacent pixel cells. In the case of a stacked photodiode structure, blooming can also occur when one of the first photodiode or second photodiode can no longer store the additional charge, and the additional charge leaks into the other photodiode in the stack or to other pixel cells. The first photodiode is especially prone to receiving leakage charge from the second photodiode since the first photodiode provides the only path to the read-out drain region. As a result, when the pixel cell is illuminated with a mixture of strong visible light and medium/weak infra-red, while the first photodiode is not saturated, the second photodiode can saturate, and the excessive second charge can leak into the first photodiode over the barrier region and corrupt the first charge.

To mitigate the flow of excessive second charge from the second photodiode into the first photodiode, a pixel cell can include an anti-blooming channel region which can be provided to conduct the excessive second charge away from the second photodiode and from the barrier layer. The anti-blooming channel region can be connected to a second drain region and/or to the read-out drain region within the pixel cell to prevent the excessive charge from leaking out of the pixel cell.

The anti-blooming channel region can have various structures. In some examples, the anti-blooming channel region can be formed within the semiconductor substrate that includes the first photodiode and the second photodiode, and can intersect the barrier layer. The anti-blooming channel region can connect between the second photodiode and the read-out drain region and/or a second drain region formed underneath the front side surface. The read-out drain region (when not used for read-out) and the second drain region can be connected to a charge sink to drain away the excessive second charge received from the blooming channel region. The anti-blooming channel region can be formed by multiple ion implantation processes.

In some examples, the anti-blooming channel region and the second drain region can also be formed on the back side surface of the semiconductor substrate, such that the second photodiode is sandwiched between the barrier layer and the anti-blooming channel region. Each of the anti-blooming channel region and the second drain region can be connected to a voltage source to set their respective electrical potentials to drain away the excessive second charge from the second photodiode. The anti-blooming channel region can be formed as an epitaxy layer.

Examples of the present disclosure may include, or be implemented in conjunction with, an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel cell array comprising an array of pixel cells and configured to generate image data representing different fields of views along different directions. For example, sensors 120a and 120b may be configured to provide image data representing two field of views towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some embodiments, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light and/or light patterns in a dark environment (or in an environment with low intensity of infra-red light, ultra-violet light, etc.) to assist sensors 120a-120d in capturing 3D images of different objects within the dark environments. The 3D images may include, for example, pixel data representing the distances between the objects and near-eye display 100. The distance information can be used to, for example, construct a 3D model of the scene, to track a head movement of the user, to track a location of the user, etc. As to be discussed in more detail below, sensors 120a-120d can be operated in a first mode for 2D sensing and in a second mode for 3D sensing at different times. The 2D and 3D image data can be merged and provided to a system to provide a more robust tracking of, for example, the location of the user, the head movement of the user, etc.

Figure 1B:
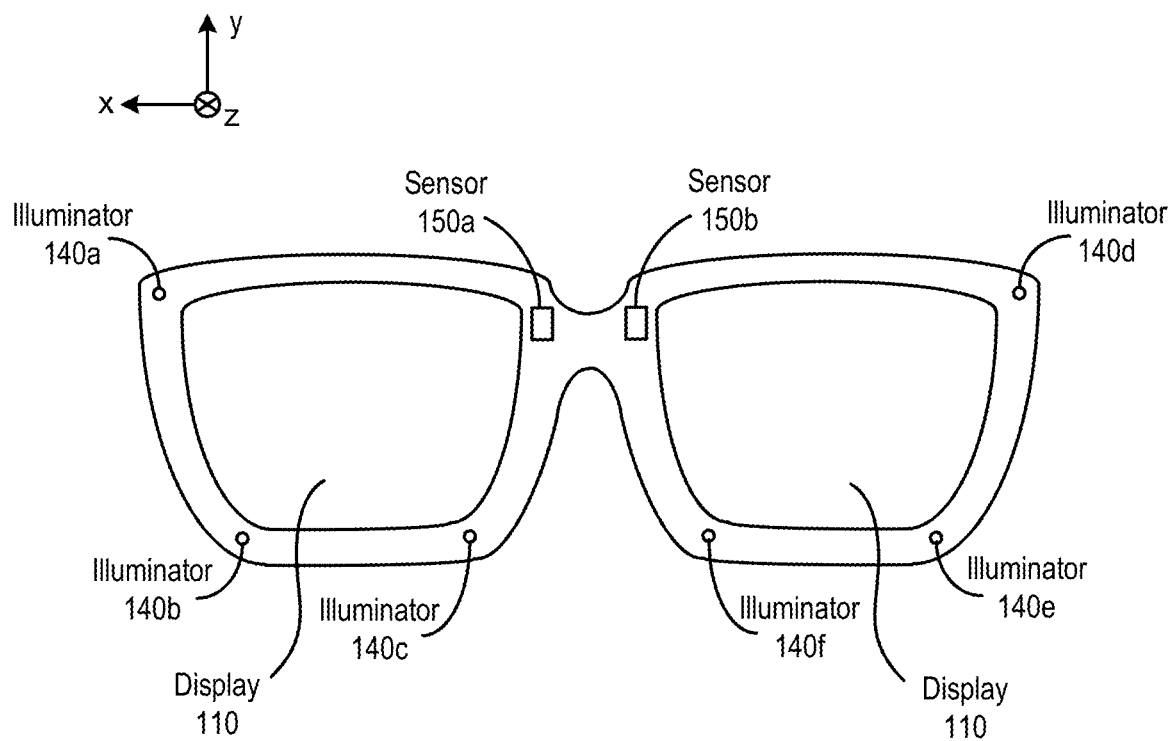
Figure 1B:
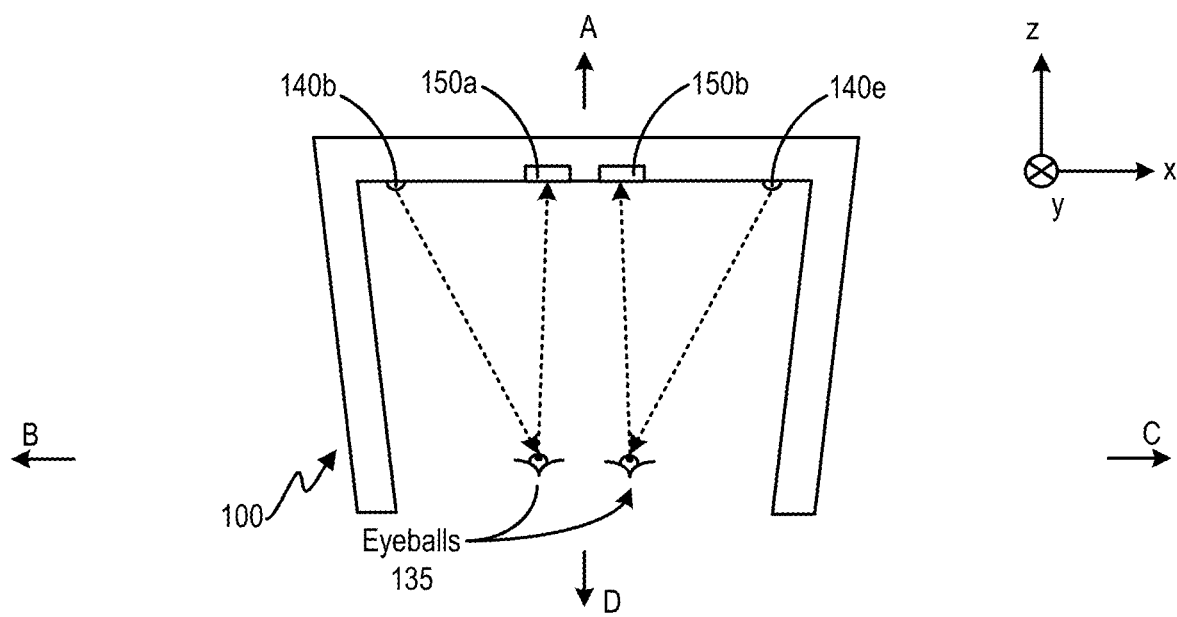

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain optical frequency range (e.g., NIR) towards direction D (which is opposite to direction A of FIG. 1A). The emitted light may be associated with a certain pattern, and can be reflected by the left eyeball of the user. Sensor 150a may include a pixel cell array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel cell array to generate an image of the reflected pattern. Based on the images of the reflected pattern from sensors 150a and 150b, the system can determine a gaze point of the user, and update the image data provided to display 100 based on the determined gaze point to provide an interactive experience to the user. In some examples, image sensors 150a and 150b may include the same pixel cells as sensors 120a-120d.

Figure 2:
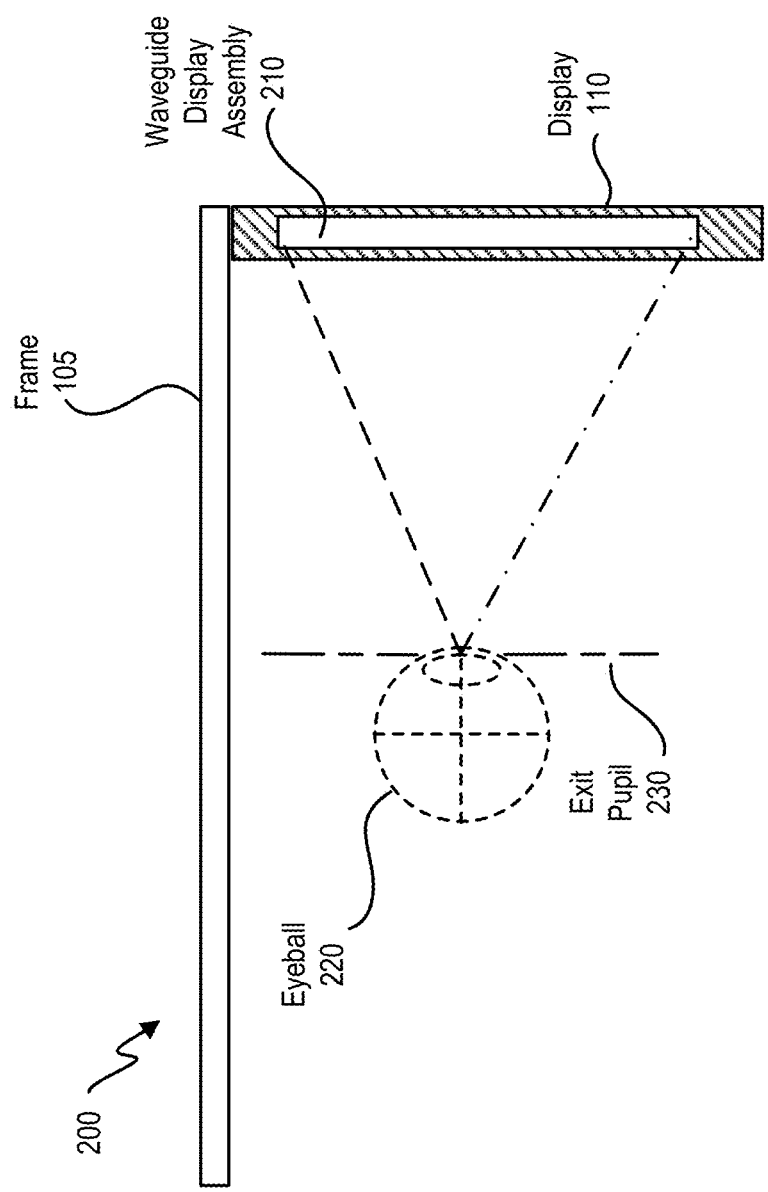
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
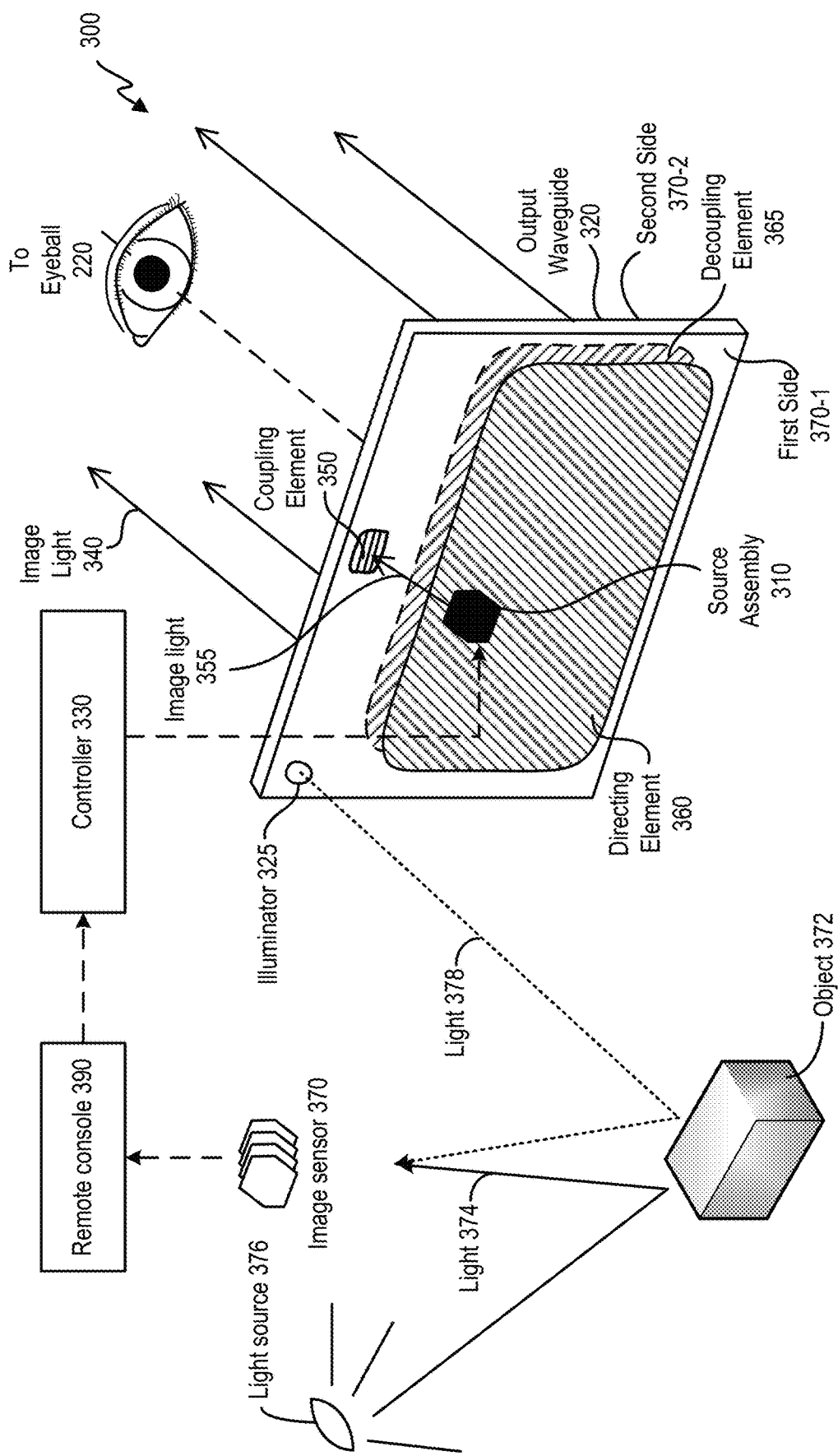
FIG. 3 illustrates an isometric view of an embodiment of a waveguide display.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, an illuminator 325, and a controller 330. Illuminator 325 can include illuminator 130 of FIG. 1A. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A. Image sensors 120a-120d can be operated to perform 2D sensing and 3D sensing of, for example, an object 372 in front of the user (e.g., facing first side 370-1). For 2D sensing, each pixel cell of image sensors 120a-120d can be operated to generate pixel data representing an intensity of light 374 generated by a light source 376 and reflected off object 372. For 3D sensing, each pixel cell of image sensors 120a-120d can be operated to generate pixel data representing a time-of-flight measurement for light 378 generated by illuminator 325. For example, each pixel cell of image sensors 120a-120d can determine a first time when illuminator 325 is enabled to project light 378 and a second time when the pixel cell detects light 378 reflected off object 372. The difference between the first time and the second time can indicate the time-of-flight of light 378 between image sensors 120a-120d and object 372, and the time-of-flight information can be used to determine a distance between image sensors 120a-120d and object 372. Image sensors 120a-120d can be operated to perform 2D and 3D sensing at different times, and provide the 2D and 3D image data to a remote console 390 that may be (or may be not) located within waveguide display 300. The remote console may combine the 2D and 3D images to, for example, generate a 3D model of the environment in which the user is located, to track a location and/or orientation of the user, etc. The remote console may determine the content of the images to be displayed to the user based on the information derived from the 2D and 3D images. The remote console can transmit instructions to controller 330 related to the determined content. Based on the instructions, controller 330 can control the generation and outputting of image light 355 by source assembly 310, to provide an interactive experience to the user.

Figure 4:
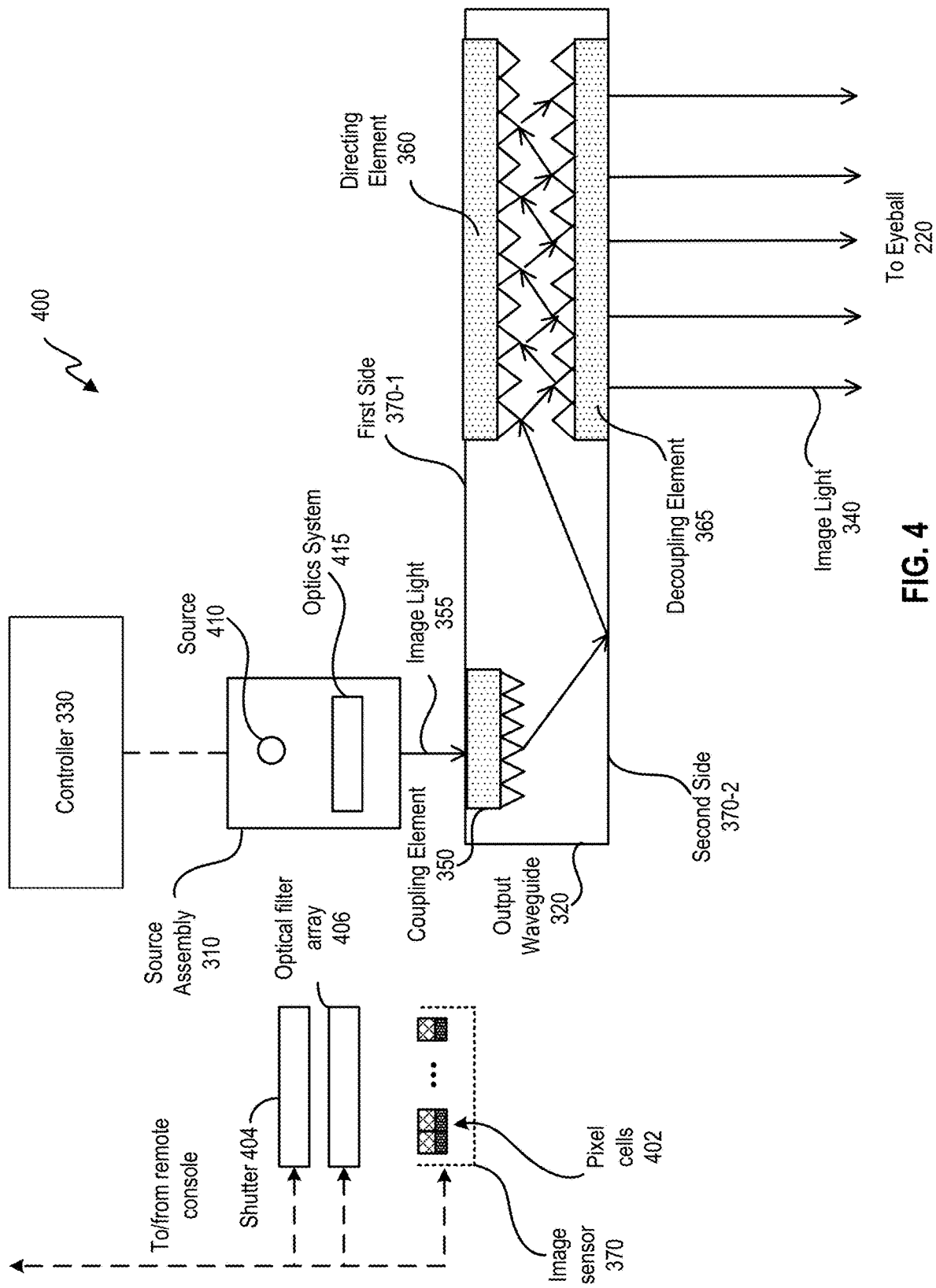
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 and an optical filter array 406 interposed between the set of pixel cells 402 and the physical environment. Mechanical shutter 404 can control the exposure of the set of pixel cells 402. In some embodiments, the mechanical shutter 404 can be replaced by an electronic shutter gate, as to be discussed below. Optical filter array 406 can control an optical wavelength range of light the set of pixel cells 402 is exposed to, as to be discussed below. Each of pixel cells 402 may correspond to one pixel of the image. Although not shown in FIG. 4, it is understood that each of pixel cells 402 may also be overlaid with a filter to control the optical wavelength range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
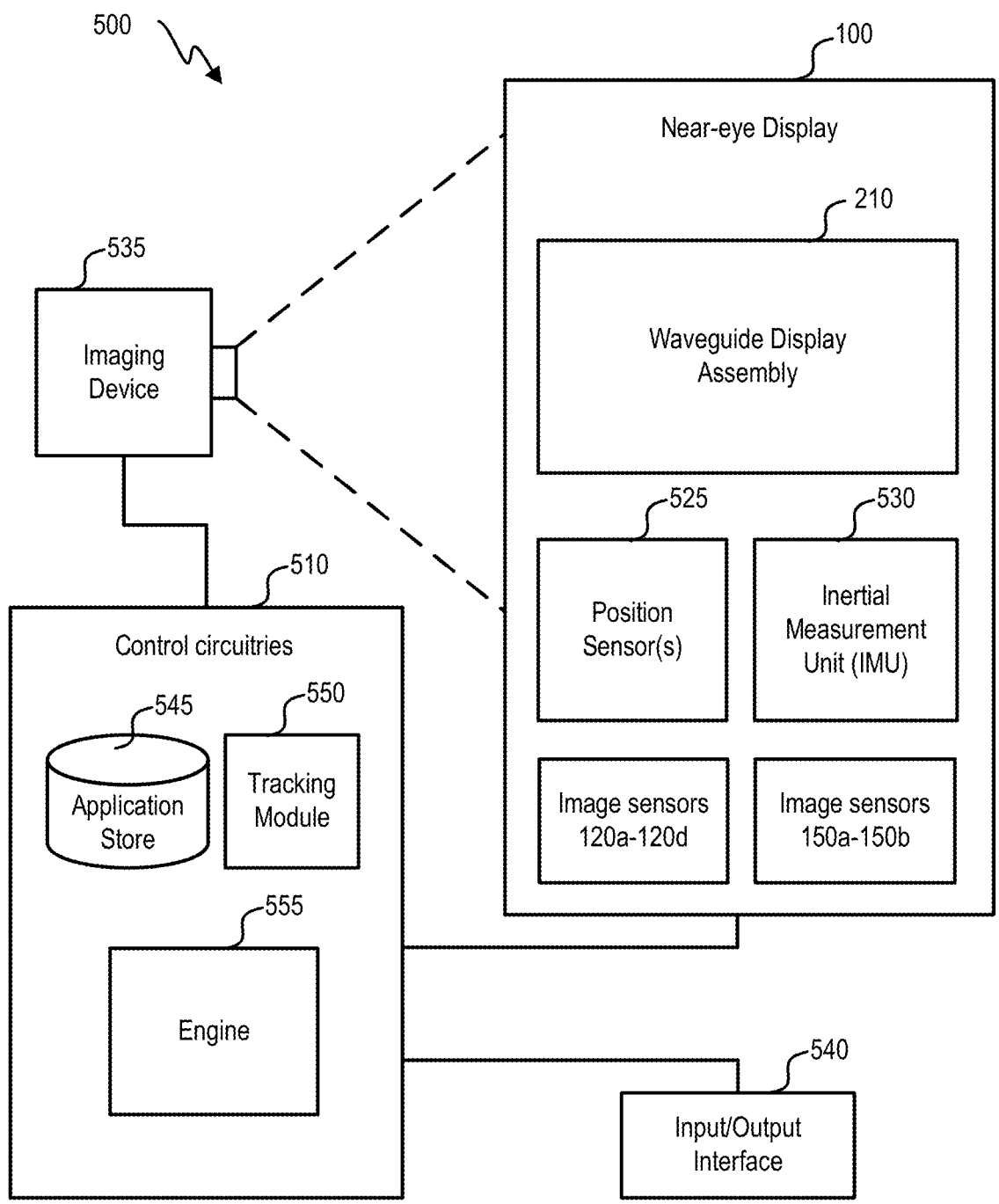
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating 2D image data and 3D image data of a physical environment in which the user is located to track the location and head movement of the user. Imaging device 535 may further include, for example, image sensors 150a-150b of FIG. 1B for generating image data (e.g., 2D image data) for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provides media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), a distance between an object and user (e.g., based on image data provided by imaging device 535).

Figure 6:
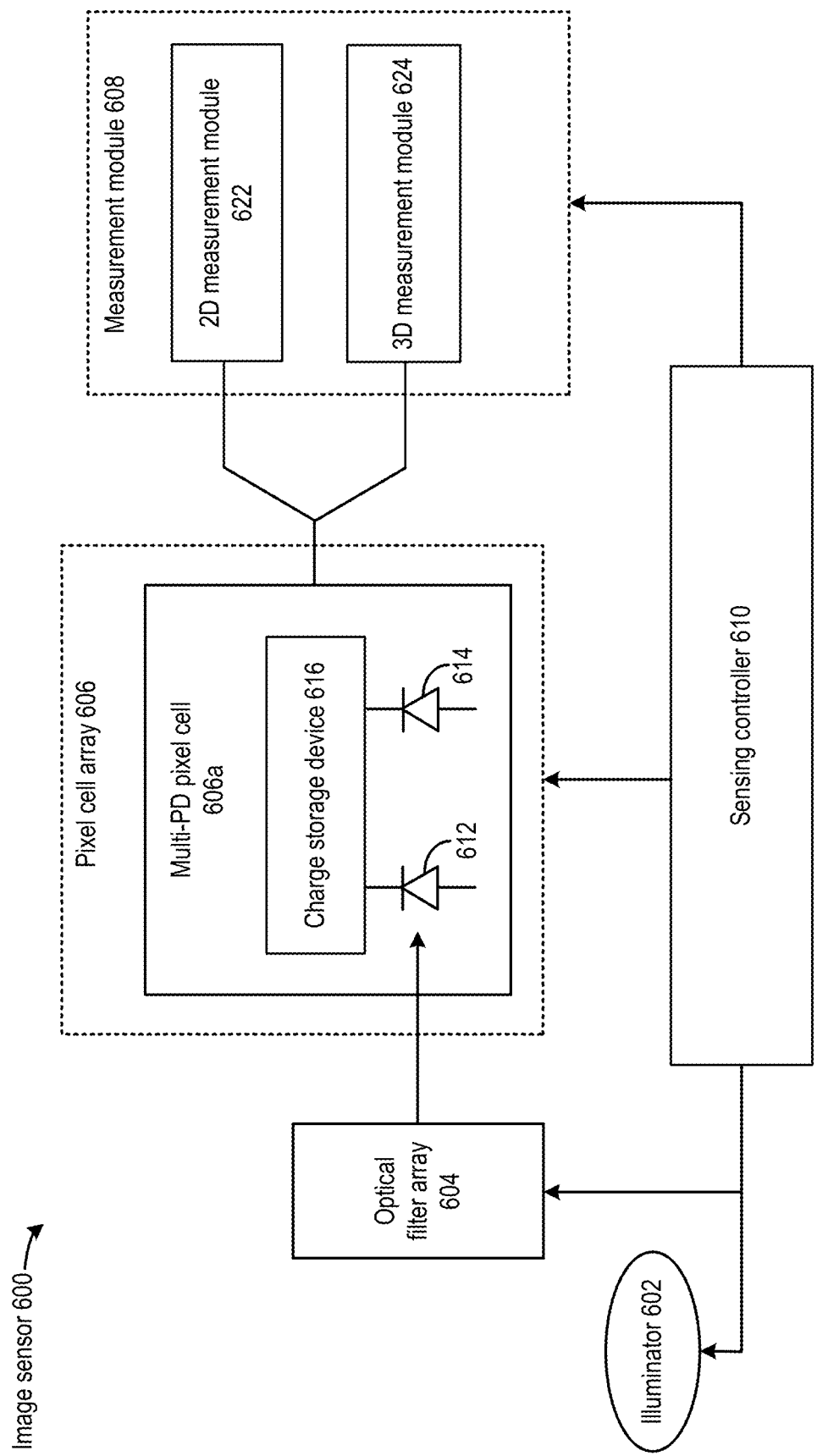
FIG. 6 illustrates an example of an image sensor including a multi-photodiode pixel cell.

FIG. 6 illustrates an example of an image sensor 600. Image sensor 600 can use the same pixel cell for both 2D sensing and 3D sensing. For example, the same pixel cell can be configured to detect a color component (e.g., red, green, or blue color) of visible light for 2D sensing, and to detect infra-red light for 3D sensing. Image sensor 600 can be part of near-eye display 100, and can provide 2D and 3D image data to control circuitries 510 of FIG. 5 to control the display content of near-eye display 100. In the example of FIG. 6, image sensor 600 may include an illuminator 602, an optical filter array 604, a pixel cell array 606, including a pixel cell 606a, and a digitizer module 608.

Illuminator 602 may be an infra-red illuminator, such as a laser, a light emitting diode (LED), etc., that can project infra-red light for 3D sensing. The projected light may include, for example, structured light, light pulses, etc. Optical filter array 604 may include an array of filter elements, with each filter element corresponding to a pixel cell of pixel cell array 606 (e.g., pixel cell 606a). Each filter element can be configured to absorb a certain wavelength range of incident light and transmit the rest of the light to the corresponding pixel cell. The incident light may include ambient visible light as well as infra-red light projected by illuminator 602 and reflected by an object. For example, one filter element may transmit a green component of visible light as well as the infra-red light to a pixel cell, whereas another filter element may transmit a blue component of visible light as well as the infra-red light to another pixel cell. In some examples, optical filter array 604 may be configurable to select the color component of visible light to be transmitted with the infra-red light, so that the pixel cell 606a can be used to detect different color components of visible light as well as infra-red light.

Moreover, pixel cell 606a may include multiple photodiodes to detect the different color components of visible light as well as infra-red light of the incident light. For example, as shown in FIG. 6, pixel cell 606a may include a photodiode 612 and a photodiode 614. Photodiode 612 and photodiode 614 can be pinned photodiodes. Photodiode 612 may detect a first component of the incident light of a first wavelength range (e.g., one of red, blue or green colors of visible light), convert the detected photons to charge, and store the charge, within an exposure period. Moreover, photodiode 614 may detect a second component of the incident light of a second wavelength range (e.g., infra-red light), convert the detected photons to charge, and store the charge, within the same or different exposure periods. Pixel cell 606a may further include a charge storage device 616, which can include a floating drain node, a metal capacitor, or a combination of both. At the end of the exposure periods, the charge stored at photodiodes 612 and 614 can be transferred to charge storage device 616 to develop voltages for 2D and 3D sensing.

Image sensor 600 further includes a measurement module 608. Measurement module 608 may further include a 2D measurement module 622 to perform 2D imaging operations based on the charge generated by photodiode 612. The 2D imaging operation may include, for example, generating a pixel value based on the magnitude of the voltage developed at charge storage device 616 which reflects the total quantity of charge stored at photodiode 612 during the exposure period. Measurement module 608 may include a 3D measurement module 624 to perform 3D imaging operations based on the charge generated by photodiode 614. The 3D imaging operations may include, for example, detecting a pattern of structured light reflected by a surface of an object, and comparing the detected pattern with the pattern of structured light projected by illuminator 602 to determine the depths of different points of the surface with respect to the pixel cells array. For detection of the pattern of reflected light, 3D measurement module 624 can generate a pixel value based on the magnitude of the voltage developed at charge storage device 616 which reflects the total quantity of charge stored at photodiode 614 during the exposure period. As another example, 3D measurement module 624 can generate a pixel value representing a time-of-flight measurement of light pulses transmitted by illuminator 602 and reflected by the object.

Figure 7A:
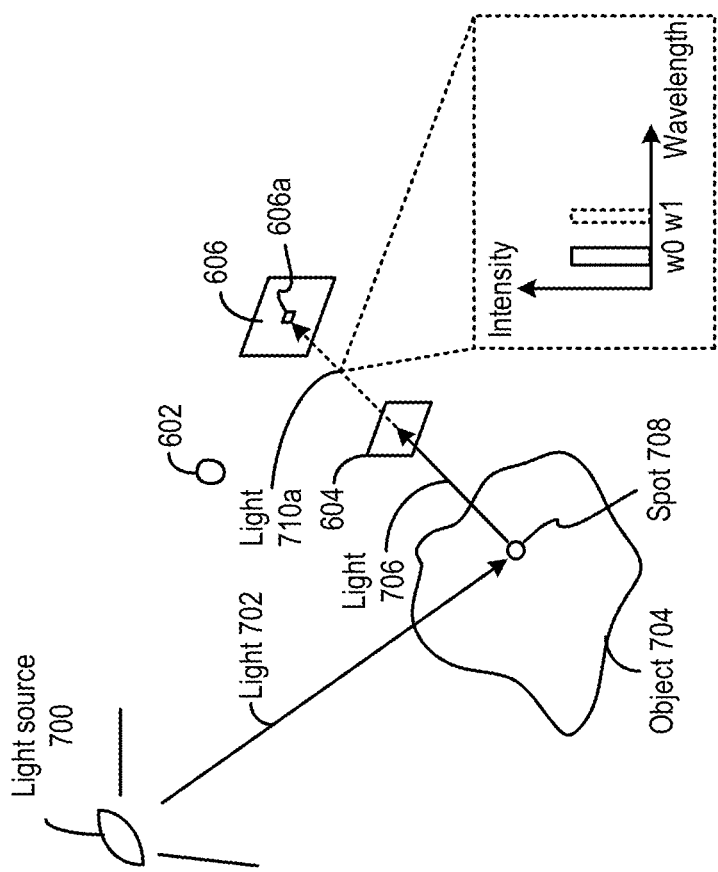
FIG. 7A and FIG. 7B illustrate examples of operations of the image sensor of FIG. 6.
Figure 7B:
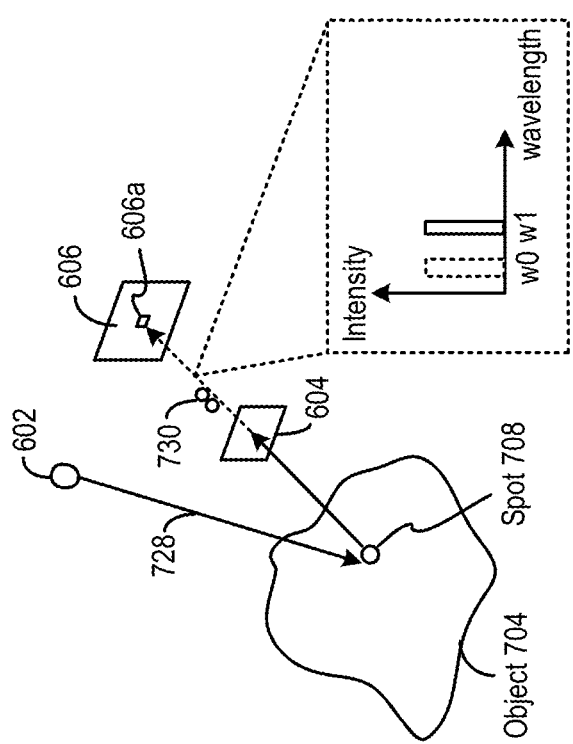

Image sensor 600 further includes a sensing controller 610 to control different components of image sensor 600 to perform 2D and 3D imaging of an object. Reference is now made to FIG. 7A and FIG. 7B, which illustrate examples of operations of image sensor 600 for 2D and 3D imaging. FIG. 7A illustrates an example of operations for 2D imaging. For 2D imaging, pixel cells array 606 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can be filtered by optical filter array 604 to pass a pre-determined wavelength range w0 of the reflected visible light 706, to produce filtered light 710a. Wavelength range w0 may correspond to a first color component of visible light 706 (e.g., a red color component having a wavelength range of 620-750 nanometers (nm)) reflected off spot 708. Filtered light 710a can be captured by first photodiode 612 of pixel cell 606a to generate and accumulate the first charge within an exposure period. At the end of the exposure period, sensing controller 610 can steer the first charge to charge storage device 616 to generate the voltage representing the intensity of the first color component, and provide the first voltage to 2D measurement module 622. 2D measurement module 622 may include an analog-to-digital converter (ADC) and can be controlled by sensing controller 610 to sample and quantize the first voltage to generate a digital value representing the intensity of the first color component of visible light 706.

Furthermore, image sensor 600 can also perform 3D imaging of object 704. Referring to FIG. 7B, sensing controller 610 can control illuminator 602 to project infra-red light 728, which can include a light pulse, structured light, etc., onto object 704. Infra-red light 728 can have a wavelength range of 700 nanometers (nm) to 1 millimeter (mm). Infra-red photons 730 can reflect off object 704 and propagate towards pixel cells array 606 and pass through optical filter 604. In some examples, second photodiode 614 of pixel cell 606a can convert infra-red photons 730 into second charge. The detection and conversion of infra-red photons 730 by second photodiode 614 can occur within the same exposure period as the detection and conversion of visible light 706 by first photodiode 612. Such arrangements allow each pixel cell to perform 2D and 3D imaging of the same spot of an object, which can improve the correspondence between the 2D and 3D images. Sensing controller 610 can steer the second charge to charge storage device 616 to generate the a voltage representing the intensity of the infra-red light received at the pixel cell.

3D measurement module 624 can perform different types of depth-sensing operations based on the type of light 728 projected onto object 704. In a case where structured light 728 is projected onto object 704, 3D measurement module 624 may include an ADC and can be controlled by sensing controller 610 to sample and quantize the second voltage to generate a digital value representing the intensity of the infra-red light reflected by spot 708. A pattern of infra-red light intensities reflected by object 704 can be obtained from the digital values. The pattern can be compared with the structured light pattern projected by illuminator 602 to determine the depths of different spots on the surface of object 704, including spot 708, with respect to pixel cells array 606. In a case where infra-red light 728 includes light pulses, 3D measurement module 624 can detect a change of stored charge at second photodiode 614. A time-of-flight of an infra-red light pulse can be determined based on a time difference between when the light pulse exits illuminator 602 and when the change of stored charge at second photodiode 614 is detected. Based on the information provided by each pixel cell, a 3D image of object 704 can be generated.

Figure 8:
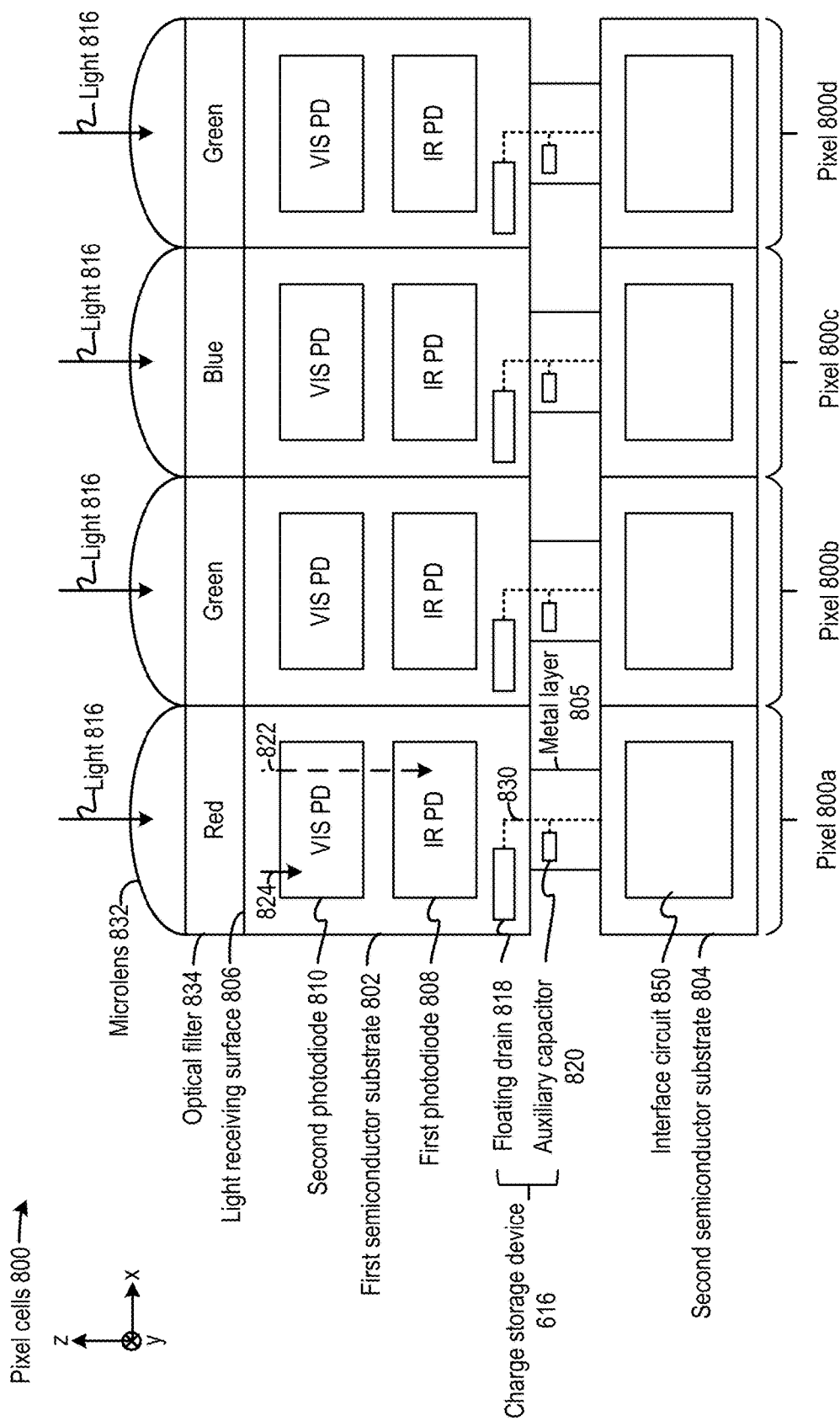
FIG. 8 illustrates an example of an array of pixel cells that can be part of the image sensor of FIG. 6.

FIG. 8 illustrates an example of an array of pixel cells 800 (e.g., pixel cells 800a, 800b, 800c, and 800d) which can perform collocated 2D and 3D image sensing and can be part of image sensor 600. As shown in FIG. 8, each of pixel cells 800 can include a first semiconductor substrate 802, a second semiconductor substrate 804, and a metal layer 805 sandwiched between the substrates. First semiconductor substrate 802 can include a light receiving surface 806, a first photodiode 808, a second photodiode 810, and charge storage device 616, whereas second semiconductor substrate 804 can include an interface circuit 850. First photodiode 808 and second photodiode 810 can form a stack along an axis perpendicular to light receiving surface 806 (e.g., along the z-axis). Second photodiode 810 can be configured as a visible light sensing photodiode ("VIS PD") whereas first photodiode 808 can be configured as an infra-red light sensing photodiode ("IR PD"). Specifically, second photodiode 810 can be closer to light receiving surface 806 than first photodiode 808. As light 816 enters via light receiving surface 806 and propagates within first semiconductor substrate 802, a first light component 822 of light 816 having the relatively longer infra-light wavelength range can propagate through second photodiode 810 and can be absorbed by first photodiode 808. Moreover, a second light component 824 of light 816 having the relatively shorter visible light wavelength range stops at second photodiode 810 and can be absorbed by second photodiode 810.

Each of pixel cells 800 also includes optical components to control the properties of first light component 822 and second light component 824 of light 816. For example, each of pixel cells 800 includes a microlens 832 to focus light 816, as well as an optical filter 834 to select, for example, the wavelength range of second light component 824 (e.g., one of red, green, or blue colors) to be absorbed/measured by second photodiode 810. As shown in FIG. 8, each of pixel cells 800a, 800b, 800c, and 800d can receive infra-red light as first light component 822, but receive visible light of different wavelength ranges as second light component 824 based on the configuration of color filter 834. In the example of FIG. 8, pixel cell 800a may receive red light as second light component 824, and pixel cells 800b and 800d may receive green light as second light component 824, whereas pixel cell 800c may receive blue light as second light component 824.

Each of first photodiode 808 and second photodiode 810 can generate charge responsive to, respectively, first light component 822 and second light component 824. The rate of charge generation by each photodiode can represent the intensities of first light component 822 and second light component 824. The charge generated by first photodiode 808 and second photodiode 810 can be stored in charge storage device 616 which, in the example of FIG. 8, can include a floating drain node 818 in first semiconductor substrate 802 and an auxiliary metallic capacitor 820 in metal layer 805. The quantity of charge accumulated in charge storage device 616, as well as the rate of charge accumulation in charge storage device 616, can be measured by interface circuit 850. Interface circuit 850 may include measurement module 608 of FIG. 6 to determine, for example, the intensities of first light component 822 and second light component 824. Metal layer 105 further includes metal interconnects 830 which can couple floating drain node 818 and auxiliary metallic capacitor 820 with measurement module 608 of second semiconductor substrate 804. Metal interconnects 830 can transmit voltages developed at charge storage device 616 corresponding to the charge generated by first photodiode 808 and second photodiode 810 to measurement module 608 to perform measurements for the 2D and 3D image sensing operations as described above.

Although FIG. 8 illustrates first photodiode 808 and second photodiode 810 of pixel cell 800 forms a stack structure which enables the two photodiodes to sense different light components, pixel cell 800 can adopt other configurations to separate the light components. For example, the two photodiodes can be arranged adjacent to each other along an axis parallel with light receiving surface 806 (e.g., along the x or y axes), and an optical structure can be provided on light receiving surface 806 to split the light components and project/direct different light components to the photodiodes.

Figure 9A:
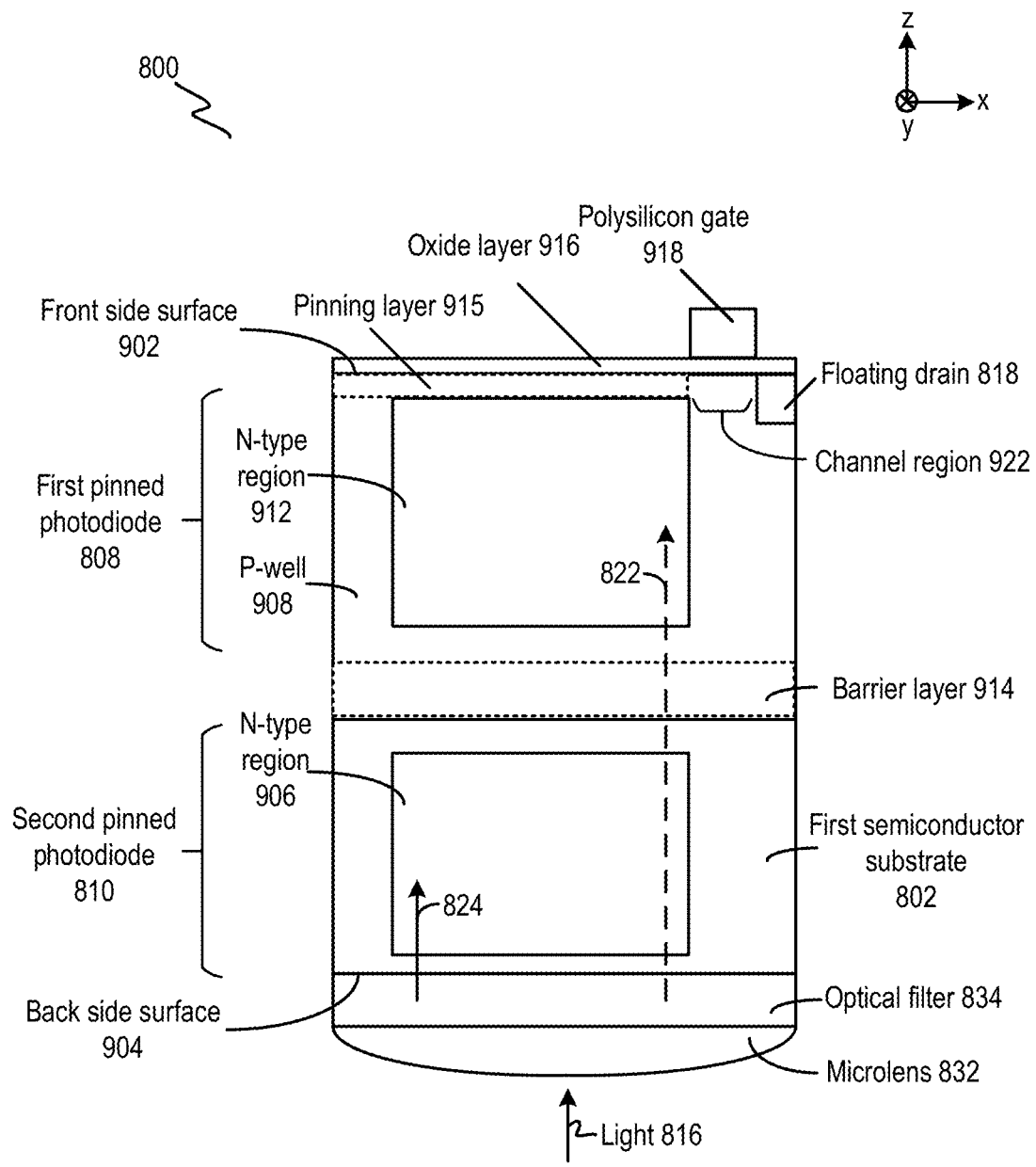
FIG. 9A and FIG. 9B illustrate examples of internal components of a pixel cell of FIG. 8.
Figure 9B:
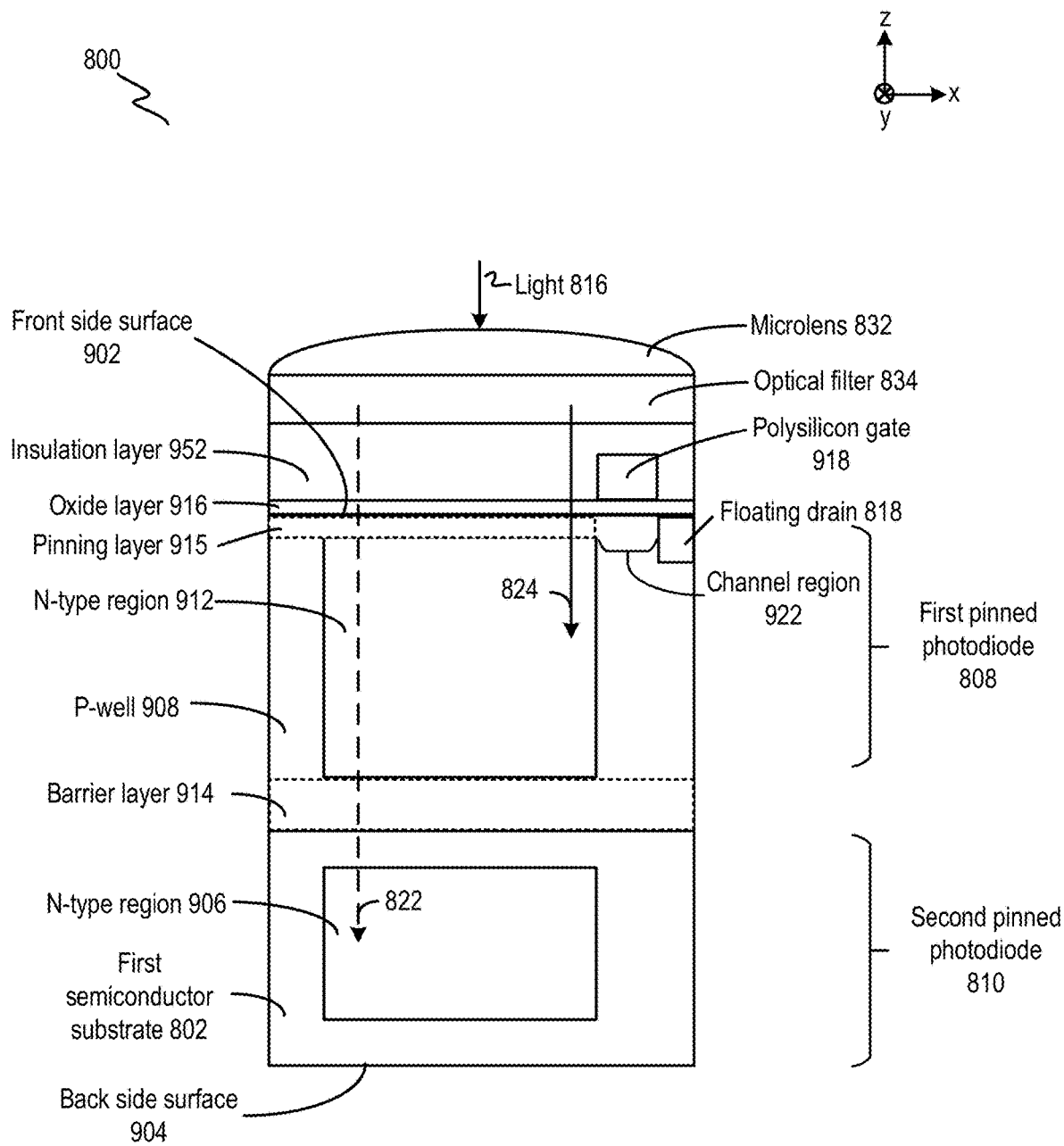

Reference is now made to FIG. 9A and FIG. 9B, which illustrate examples of other components of semiconductor substrate 802 not shown in FIG. 8. FIG. 9A and FIG. 9B and illustrate pixel cell 800 formed in a P-type semiconductor substrate 802. In FIG. 9A and FIG. 9B, semiconductor substrate 802 can have a front side surface 902 and a back side surface 904. Front side surface 902 is where additional semiconductor processing is done, such as formation of polysilicon gate 918, and doping and/or ion implantation to form first photodiode 808, second photodiode 810, floating drain node 818, a pinning layer 915, etc. In FIG. 9A, pixel cell 800 can be configured as a back side illuminated (BSI) device, in which back side surface 904 is configured as light receiving surface 806, and microlens 832 and optical filter 834 can be placed on back side 904 surface to control the properties of first light component 822 and second light component 824 of light 816. In FIG. 9B, pixel cell 800 can be configured as a front side illuminated (FSI) device, in which front side surface 902 is configured as light receiving surface 806. An insulation layer 952 can be put over polysilicon gate 918 and oxide layer 916 on front side surface 902, and microlens 832 and optical filter 834 can be placed on insulation layer 952 to control the properties of first light component 822 and second light component 824 of light 816.

In the examples of FIG. 9A and FIG. 9B, first photodiode 808 and second photodiode 810 can be configured as pinned photodiodes. In FIG. 9A and FIG. 9B, pixel cell 800 includes a P-well 908 and an N-type region 912 embedded within P-well 908 to form first pinned photodiode 808. Moreover, second pinned photodiode 810 can be formed by including an N-type region 906 embedded within P-type semiconductor substrate 802. In FIG. 9A, N-type region 912 is further away from back side surface 904 (configured as light receiving surface 806) than N-type region 906, which allows first pinned photodiode 808 to primarily detect an infra-red component (e.g., first light component 822) of light 816 and second pinned photodiode 810 to primarily detect a visible light component (e.g., second light component 824) of light 824. In FIG. 9B, N-type region 912 is closer to front side surface 902 (configured as light receiving surface 806) than N-type region 906, and the roles of first pinned photodiode 808 and second pinned photodiode 810 can be reversed. In FIG. 9B, first pinned photodiode 808 can detect a visible light component (e.g., second light component 824), whereas second pinned photodiode 810 can detect an infrared component (e.g., first light component 822). First pinned photodiode 808 and second pinned photodiode 810 can have the same or different pinning voltages (e.g., maximum voltage difference across the photodiodes). In both first pinned photodiode 808 and second pinned photodiode 810, the complete isolation of N-type region 906 and N-type region 912 within P-type substrate 901 and P-well 908 can provide better dark-current and noise performance.

In both FIG. 9A and FIG. 9B, a barrier layer 914 is also formed between first pinned photodiode 808 and second pinned photodiode 810, and first pinned photodiode 808, barrier layer 914, and second pinned photodiode 810 can form a stack along a direction of propagation of light within P-type semiconductor substrate 802 (e.g., along the z-axis).

As to be described in more detail below, barrier layer 914 can prevent a charge stored in first pinned photodiode 808 from entering second pinned photodiode 810. Barrier layer 914 can also regulate flow of charge from second pinned photodiode 810 to first pinned photodiode 808 for read out and quantization. In some examples, barrier layer 914 can be a P-type layer and be part of P-well 908 (or P-type semiconductor substrate 802), or can be part of a P+ region with a higher P-type doping concentration. In some examples, barrier layer 914 can also be an N-type layer (e.g., having a lower N-type doping concentration than both N-type region 906 and N-type region 912).

As described above, pixel cell 800 further includes pinning layer 915, oxide layer 916, polysilicon gate 918, and floating drain 818 on a front side surface 902. Pinning layer 915 can be configured to separate N-type region 912 from directly interfacing with oxide layer 916 to reduce dark current caused by surface-hole combination at the interface between oxide layer 916 and the substrate, which can further improve the dark current performance of the first pinned photodiode. In some examples, pinning layer 915 can form the second pinned photodiode with N-type region 912, and P-well 908 can be removed from device 900. Polysilicon gate 918 can receive a voltage and exert an electric field, via oxide layer 916, to create a channel at a channel region 922 between N-type region 912 and floating drain 818. The channel can be created to read out a charge generated by one of the first photodiode 808 or second photodiode 810.

Figure 10A:
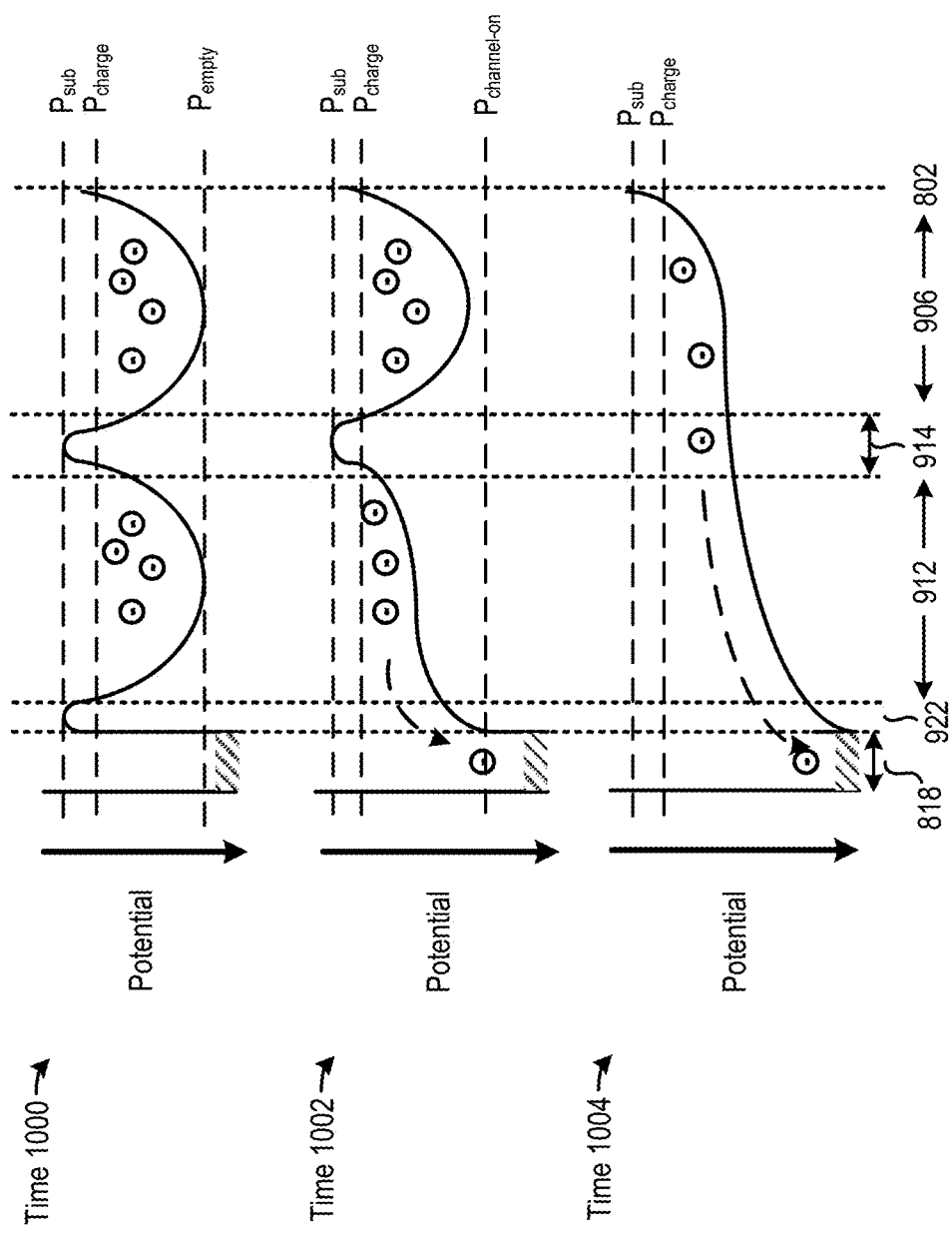
FIG. 10A and FIG. 10B illustrate examples of electrical potential distributions for read out of charges from the array of pixel cells of FIG. 8.
Figure 10B:
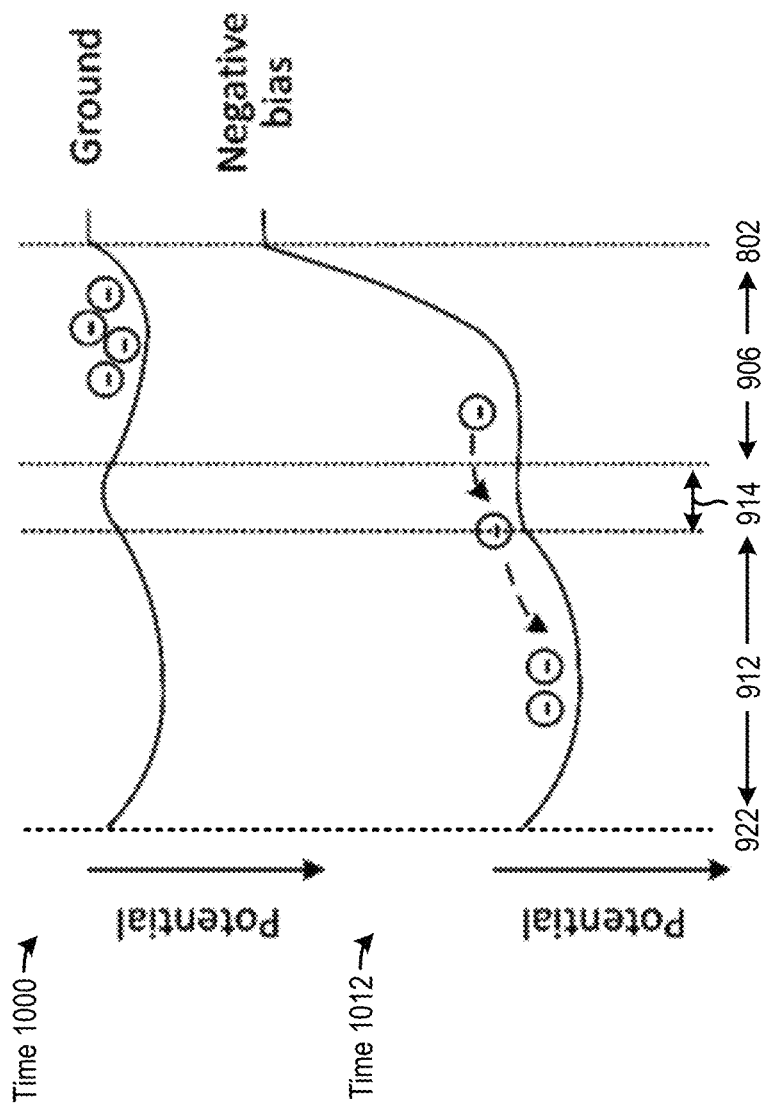

FIG. 10A and FIG. 10B illustrate examples of electrical potential distributions within first semiconductor substrate 802 for read out of charge from first or second photodiodes 808 and 810. FIG. 10A illustrates an example in which the electrical potential of barrier layer 914 is modulated with respect to time to perform the read out. Referring to FIG. 10A, at time 1000, N-type region 912 and N-type region 906 store negative charged generated in response to first and second light components 822 and 824, and each can have an electrical potential $P_{charge}$. The electrical potential $P_{charge}$ can be defined based on the quantity of charge, the capacities of the quantum wells of N-type region 912 and N-type region 906, and the electrical potential of the quantum wells when they are empty, $P_{empty}$. Meanwhile, channel region 922 can be in an off state and a channel is not yet created at channel region 922. The electrical potential at channel region 922 can be at an electrical potential lower than $P_{charge}$. Moreover, barrier layer 914 can be in an off-state and can be set at an electrical potential to prevent charge from flowing between N-type region 912 and N-type region 906, and the electrical potential at N-type region 912 can also be at an electrical potential lower than $P_{charge}$. In FIG. 10A, the electrical potentials at channel region 922 and barrier layer 914 can be similar to $P_{sub}$.

At time 1000, the storage capacities of both N-type region 912 and N-type region 906 can be at the maximum. The maximum quantity of charge that can be stored in N-type region 912 can be defined based on the quantum well capacity of N-type region 912, and the electric potentials of channel region 912 and barrier substrate 914 when both are in the off-state. With such arrangements, when the maximum quantity of charge is stored in N-type region 912, $P_{charge}$ can remain higher than the electrical potentials of both barrier substrate 914 and channel region 912 to trap the charge in N-type region 912. As to be described in detail below, the electrical potential at channel region 922 can be configured to set the storage capacity of N-type region 912. Moreover, the maximum quantity of charge that can be stored in N-type region 906 can be defined based on the quantum well capacity of N-type region 906, the electrical potential $P_{sub}$ of first semiconductor substrate 802, and the electrical potential of barrier substrate 914 in the off-state, as well as $P_{empty}$, such that, when the maximum quantity of charge is stored in N-type region 906, $P_{charge}$ remains higher than the potentials of both first semiconductor substrate 802 and barrier layer 914 to trap the charge in N-type region 906.

At time 1002, the charge stored in N-type region 912 can be read out. To read out the charge, the electrical potential in channel region 922 can be increased to $P_{channel-on}$ by applying a voltage at polysilicon gate 918 to form a channel at channel region 922. Negative charge stored in N-type region 912 can flow to channel region 922 and then floating drain 818. Meanwhile, the electrical potential of barrier 914 remains at $P_{sub}$ which is lower than the electrical potential $P_{charge}$ of charge stored at N-type region 906. As a result, the charge stored at N-type region 906 remains trapped at the region.

At time 1004, the electrical potential of barrier layer 914 can be increased to be equal to or higher than $P_{charge}$. Pixel cell 800 can include various structures to adjust the electrical potential of barrier layer 914. As an example, pixel cell 800 can include a pair of conductive deep trench isolation (C-DTIs) on two sides of barrier layer 914. The pair of C-DTIs can extend from front side surface 902 or from back side surface 904. Each C-DTI can conduct a voltage to create an electric field across barrier layer 914 to move negative charge away, which can raise the electrical potential of barrier layer 914. As another example, pixel cell 800 can include a second polysilicon gate that extends from front side surface 902 to reach barrier layer 914. Oxide layer 916 can also extend from front side surface 902 and along the second polysilicon gate to insulate the second polysilicon gate from barrier layer 914. Second polysilicon gate can conduct a voltage which can push negative charge away from barrier layer 914 to raise its electrical potential.

With the electrical potential of barrier layer 914 increased, the negative charge stored at N-type region 906 can flow to N-type region 912. In the example of FIG. 10A, the electrical potential in channel region 922 can be maintained at $P_{channel-on}$ and all of the charge from N-type region 906 can be transferred to floating drain 818. In some examples, as to be described below, the charge stored at N-type region 906 can be transferred to floating drain 818 in multiple steps for measurement operations for different light intensities.

FIG. 10B illustrates another example in which the electrical potential of barrier layer 914 is kept constant, but the electrical potential of first semiconductor substrate 802 is modulated to perform the read out of charge at N-type region 906. As shown in FIG. 10B, a negative electrical potential can be applied to first semiconductor substrate 802 at time 1012, which causes the electrical potential of barrier layer 914 to become higher than that of first semiconductor substrate 802. Negative charge stored at N-type region 906 can then flow across barrier layer 914 and then channel region 922 and floating drain 818, all of which can have higher potentials than N-type region 906 when the negative electrical potential is applied to first semiconductor substrate 802.

Although the stacked photodiode structure of FIG. 9A and FIG. 9B allows collocated 2D and 3D sensing by measuring different components of light 816 received via front side surface 902 or back side surface 904, such a structure can be susceptible to blooming. Blooming can occur when the intensity of first light component 822 and/or second light component 824 is so high that first pinned photodiode 808 and/or second pinned photodiode 810 become saturated and cannot store additional charge, and the additional charge leaks into the other photodiode and/or other pixel cells that do not saturate and corrupt the charge stored there.

Figure 11:
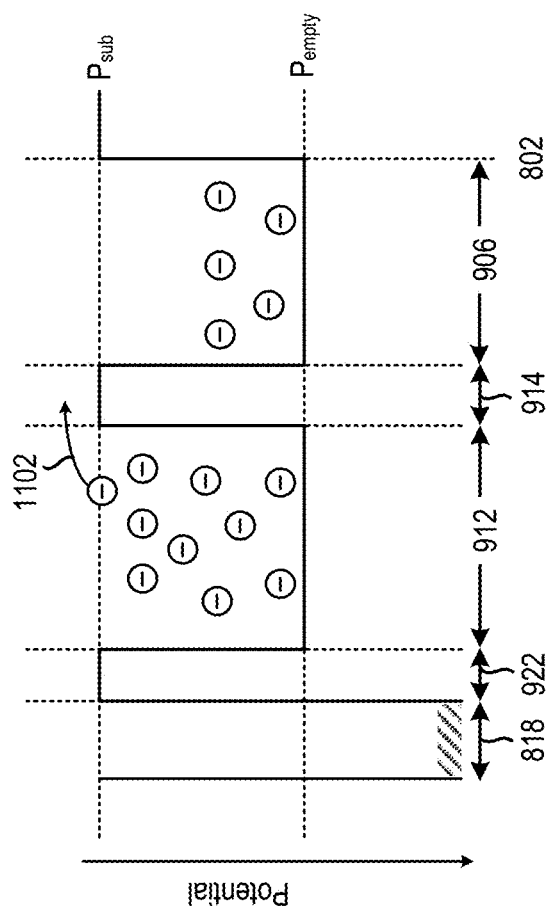
FIG. 11 illustrates an example of blooming in a pixel cell of FIG. 8.

FIG. 11 illustrates an example of blooming caused by the saturation of first photodiode 808. As shown in FIG. 11, a large quantity of negative charge can accumulate in N-type region 912 (of first photodiode 808) due to, for example, first light component 822 or second light component 824 having very high intensity. Moreover, polysilicon gate 918 can receive an off-state signal (e.g., a voltage lower than the channel-forming threshold voltage) to set channel region 922 in an off state, and a channel is not yet created at channel region 922. The electrical potential at channel region 922 and barrier layer 914 can be at $P_{sub}$. As more negative charge including charge 1102 is accumulated in N-type region 912, the electrical potential of N-type region 912 continues to drop and can become equal to below $P_{sub}$. At that point, charge 1102 can leak from N-type region 912 across barrier layer 914 and move into N-type region 906 (of second photodiode 810), and contaminate the charge accumulated in N-type region 906 which represents measurement of a different light component.

Figure 12A:
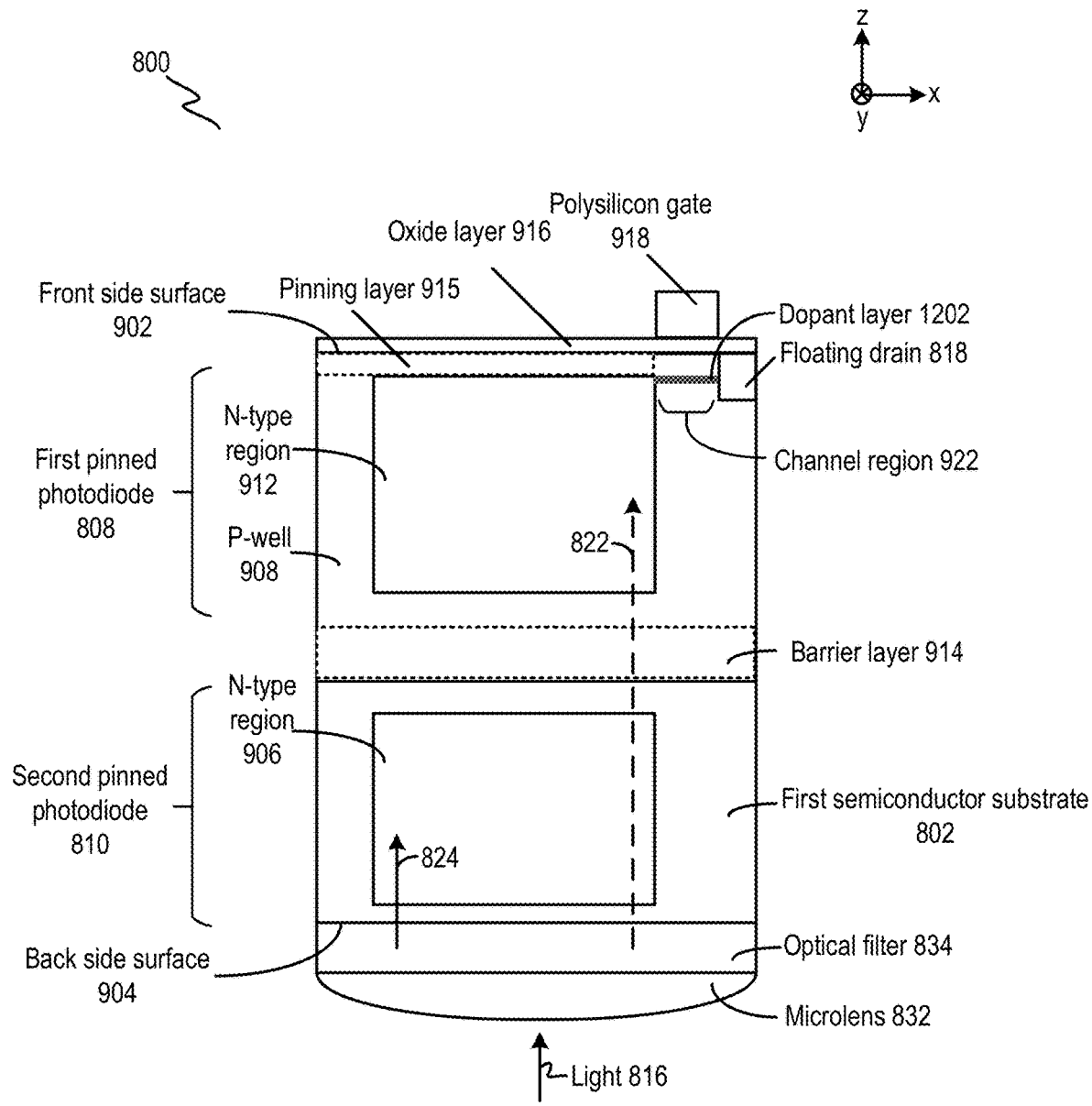
FIG. 12A, FIG. 12B, and FIG. 12C illustrate examples of components of a pixel cell of FIG. 8 to mitigate blooming and their operations.
Figure 12B:
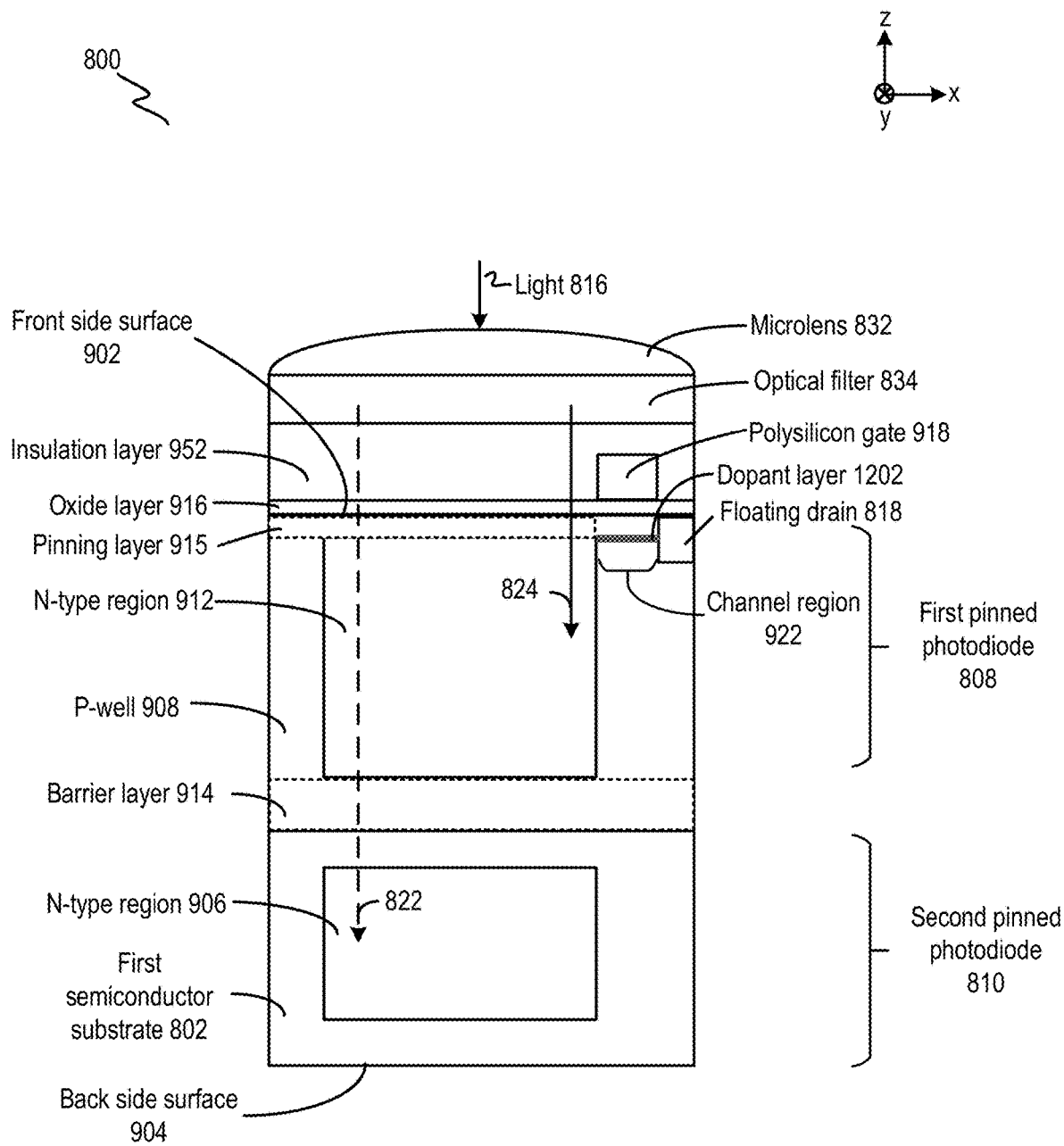

FIG. 12A and FIG. 12B illustrate examples of components of pixel cell 800 which can reduce or prevent blooming caused by the saturation of first photodiode 808. FIG. 12A illustrates pixel cell 800 as a BSI device, whereas FIG. 12B illustrates pixel cell 800 as an FSI device. As shown in FIG. 12A and FIG. 12B, channel region 922 can include a dopant layer 1202 formed in P-well 908. Dopant layer 1202 can be formed along a horizontal/lateral direction (e.g., parallel with x/y axes and/or with front side surface 902). Dopant layer 1202 can adjust the electrical potential of channel region 922 with respect to the bias voltage of P-well 908 when polysilicon gate 918 receives the off-state signal. As a result, channel region 922 can have a lower electrical potential difference with respect to the electrical potential of empty quantum well, $P_{empty}$, than barrier layer 914, which allows channel region 922 to provide a lower barrier to the negative charge than barrier layer 914. As a result, an N-type anti-blooming channel can be formed in channel region 922, between N-type region 912 and floating drain 818, to conduct away the excessive charge from first photodiode 808 and from barrier layer 914. The anti-blooming channel can be formed along a horizontal/lateral direction (e.g., parallel with x/y axes and/or with front side surface 902). Dopant layer 1202 can include an N-type dopant and can have a lower dopant concentration than, for example, N-type region 912 and floating drain 818, to avoid excessive lowering of the barrier which can reduce the full well capacity of N-type region 912. In some examples, dopant layer 1202 can be positioned away from front side surface 902 such that the anti-blooming channel can be formed as a buried channel away from front side surface 902. Compared with a surface channel formed immediately beneath front side surface 902 and oxide layer 916, a buried channel can be formed away from the crystal defects at the interface between front side surface 902 and oxide layer 916. With such arrangements, the buried channel can be less susceptible to dark current caused by recombination of charges at the crystal defects and can provide improved dark current performance.

Figure 12C:
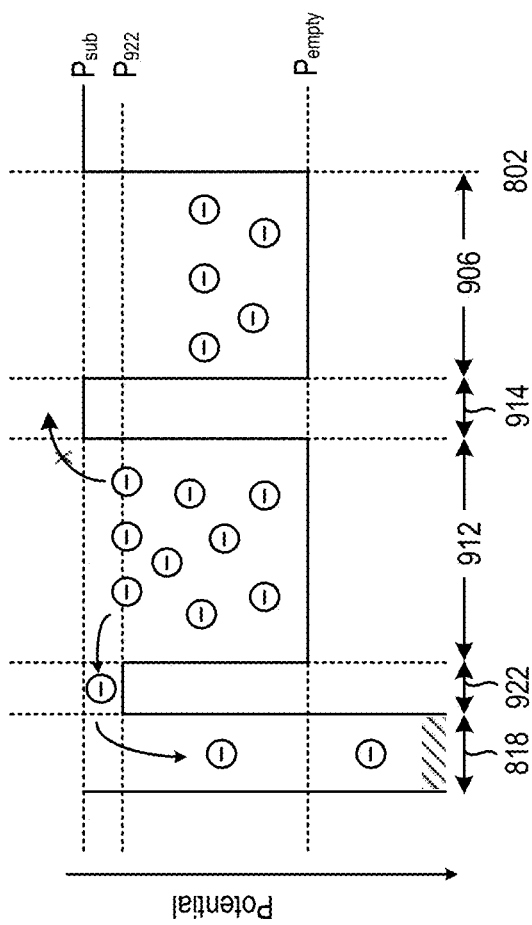

FIG. 12C illustrates an example anti-blooming operation provided by dopant layer 1202. As shown in FIG. 12C, with dopant layer 1202, the electrical potential of channel region 922 can be set at $P_{922}$ which is higher than $P_{sub}$ with respect to $P_{empty}$. As a result, channel region 922 can present a lower barrier than barrier layer 914. After the electrical potential of N-type region 912 reaches $P_{922}$ after accumulating a quantity of negative charge, additional negative charge generated at N-type region 912 can flow via channel region 922 to floating drain 818, such that the electrical potential of N-type region 912 stays at $P_{922}$. As the electrical potential of barrier layer 914 ($P_{sub}$) remains lower than $P_{922}$, the additional negative charge will not flow across barrier layer 914 into N-type region 906. Floating drain 818 can be connected to a charge sink to drain away the additional negative charge.

Figure 13:
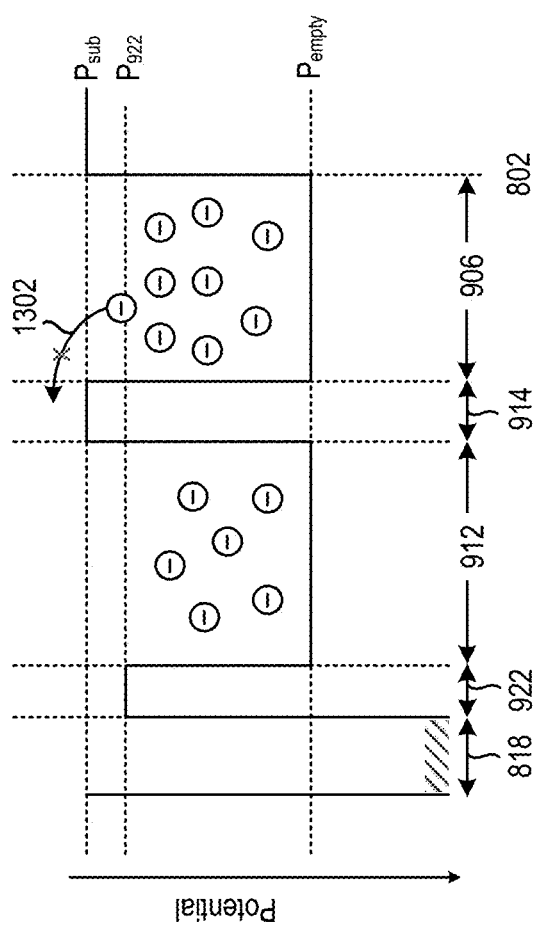
FIG. 13 illustrates another example of blooming in a pixel cell of FIG. 8.

Although dopant layer 1202 can reduce or prevent blooming caused by first photodiode 808, it cannot address blooming caused by the saturation of N-type region 906 (of second photodiode 810). As shown in FIG. 13, a large quantity of negative charge can accumulate in N-type region 906 due to, for example, first light component 822 or second light component 824 having very high intensity. As more negative charge including charge 1302 is accumulated in N-type region 906, the electrical potential of N-type region 906 continues to drop and can become equal to below $P_{sub}$. At that point, as there is no other conductive path to conduct away charge 1302, charge 1302 can leak from N-type region 906 across barrier layer 914 and move into N-type region 912 (of first photodiode 808), and contaminate the charge accumulated in N-type region 912 which represents measurement of a different light component. Charge 1302 can also leak into adjacent pixel cells and contaminate charge stored in those pixel cells.

Figure 14A:
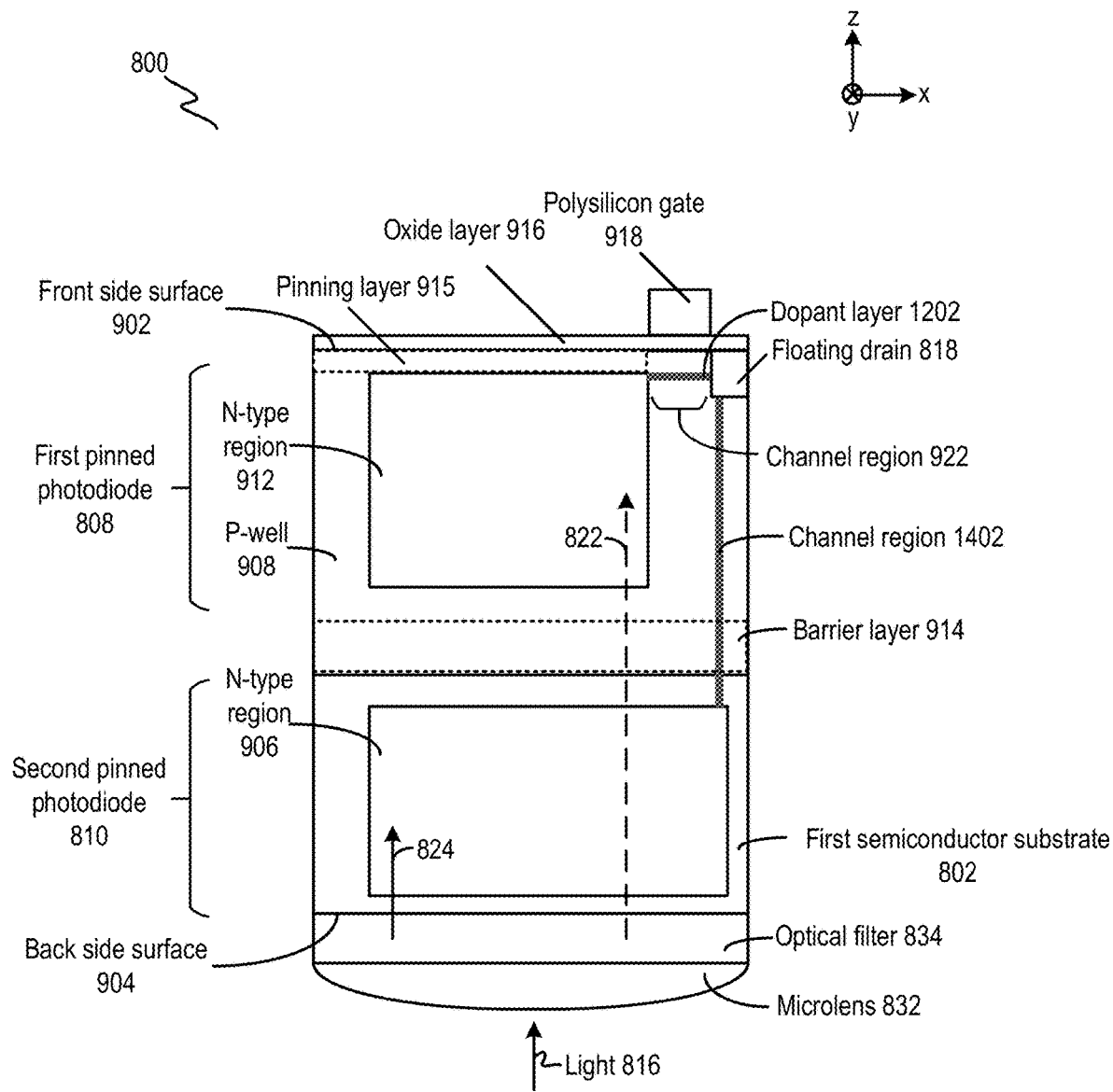
FIG. 14A, FIG. 14B, FIG. 14C, and FIG. 14D illustrate examples of components of a pixel cell of FIG. 8 to mitigate blooming and their operations.
Figure 14B:
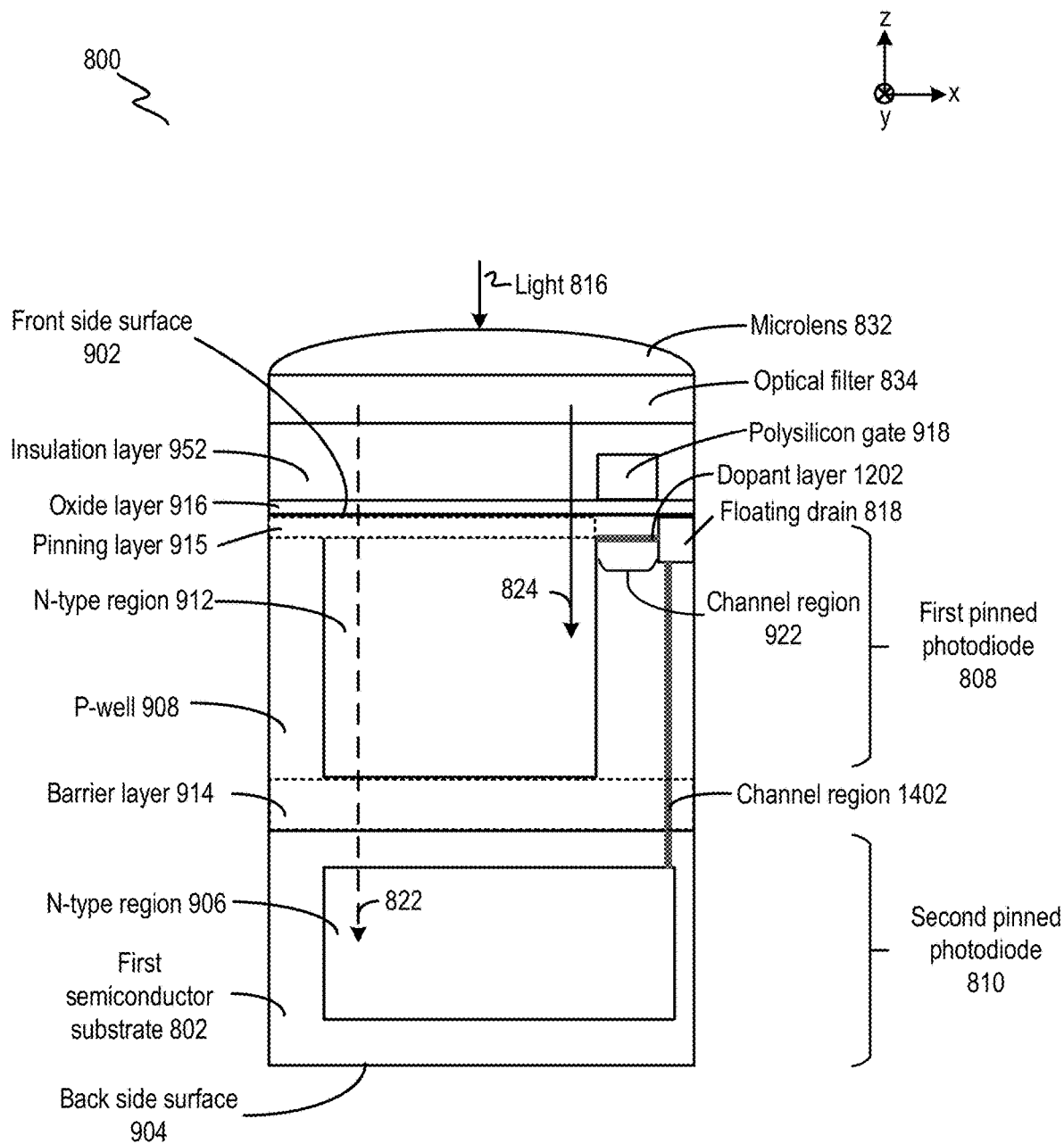

FIG. 14A and FIG. 14B illustrate examples of components of pixel cell 800 which can reduce or prevent blooming caused by the saturation of second photodiode 810. FIG. 14A illustrates pixel cell 800 as a BSI device, whereas FIG. 14B illustrates pixel cell 800 as an FSI device. As shown in FIG. 14A and FIG. 14B, pixel cell 800 can include a channel region 1402 that extends from N-type region 906 (of second photodiode 810), across barrier layer 914, and reaches floating drain 818. Channel region 1402 can be formed by, for example, one or more ion implantation processes to form a strip that intersects N-type dopant in P-well 908, P-type barrier layer 914, and P-type semiconductor substrate 802 along a vertical direction (e.g., parallel with the z-axis). The N-type dopant can set the electrical potential of channel region 1402 with respect to the bias voltages of P-well 908, P-type barrier layer 914, and P-type semiconductor substrate 802. As a result, channel region 1402 can have a lower electrical potential difference with respect to the electrical potential of empty quantum well, $P_{empty}$, than barrier layer 914, which allows channel region 1402 to provide a lower barrier to the negative charge than barrier layer 914. As a result, channel region 1402 can conduct away the excessive charge from N-type region 906 and from barrier layer 914. A vertical anti-blooming channel (e.g., parallel with the z-axis) can be formed between floating drain 818 and N-type region 906. The dopant concentration of channel region 1402 can be lower than, for example, N-type region 906 and floating drain 818, to avoid excessive lowering of the barrier which can reduce the full well capacity of N-type region 906. Multiple ion implantation steps with different implantation energies and doses can be performed from front side surface 902 to cause the N-type dopant to penetrate deep into semiconductor substrate 802 while keeping a distance away from N-type regions 912.

Figure 14C:
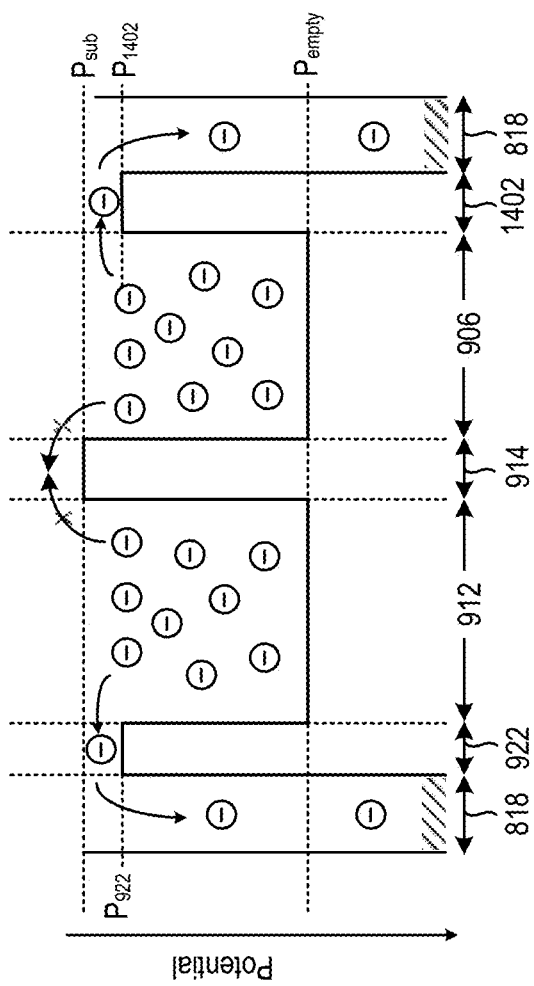

FIG. 14C illustrates example anti-blooming operations provided by channel regions 922 and 1402. As shown in FIG. 14C, the electrical potential of channel region 1402 can be set at $P_{1402}$ which is higher than $P_{sub}$ with respect to $P_{empty}$. As a result, channel region 1402 can present a lower barrier than barrier layer 914. After the electrical potential of N-type region 906 reaches $P_{1402}$ after accumulating a quantity of negative charge, additional negative charge generated at N-type region 906 can flow via channel region 1402 to floating drain 818, such that the electrical potential of N-type region 906 stays at $P_{1402}$. As the electrical potential of barrier layer 914 ($P_{sub}$) remains lower than $P_{1402}$, the additional negative charge will not flow across barrier layer 914 into N-type region 912. Moreover, as described above, another anti-blooming channel can be formed in channel region 922 to conduct away additional negative charge from N-type region 912 and from barrier layer 914. The additional negative charge from both N-type regions 906 and 912 can flow to floating drain 818, which can be connected to a charge sink to drain away the additional negative charge.

Figure 14D:
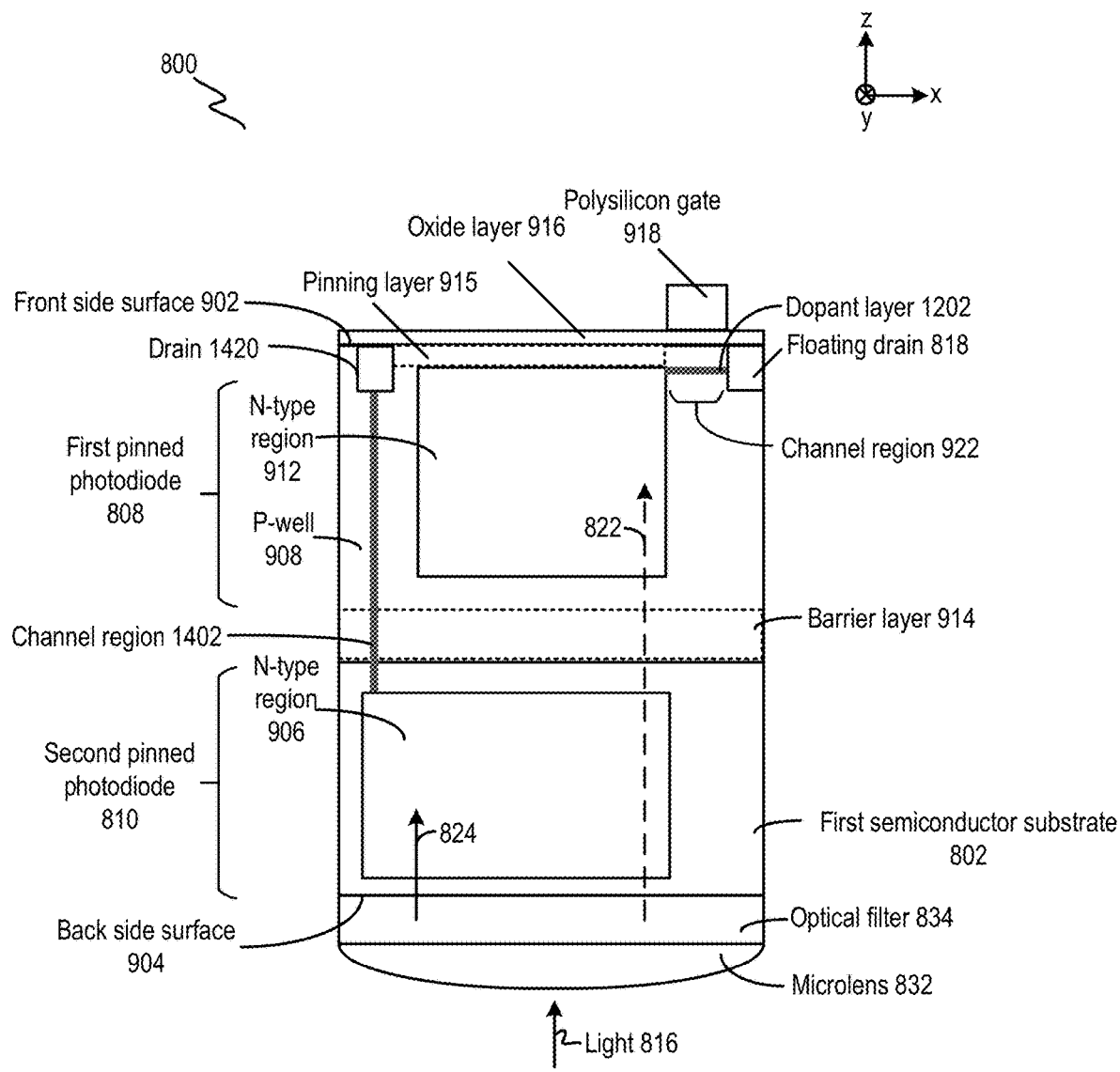

In some examples, as shown in FIG. 14D, pixel cell 800 can include a second drain 1420 to connect with channel region 1402 to drain away the excessive negative charge from N-type region 906. Such arrangements can reduce the interference of the anti-blooming operation by channel region 1402 with the readout of charge from first photodiode 808. Specifically, in the arrangements of FIG. 14A and FIG. 14B, channel region 1402 can transfer excessive charge from N-type region 906 to floating drain 818 at the same time when polysilicon gate 918 transfers charge from N-type region 912 to floating drain 818 for read out. As a result, the excessive charge from the anti-blooming operation for N-type region 912 can contaminate the readout charge at floating drain 818. On the other hand, moving the excessive charge to a second drain 1420 can avoid interfering with the read out operation at floating drain 818. Alternatively, a shutter device (e.g., shutter 404) can be used to stop the exposure of N-type regions 906 and 912 to light 816 during the readout operation, which can also reduce the interference of the anti-blooming operation for N-type region 912 with the read out operation at floating drain 818.

Figure 15A:
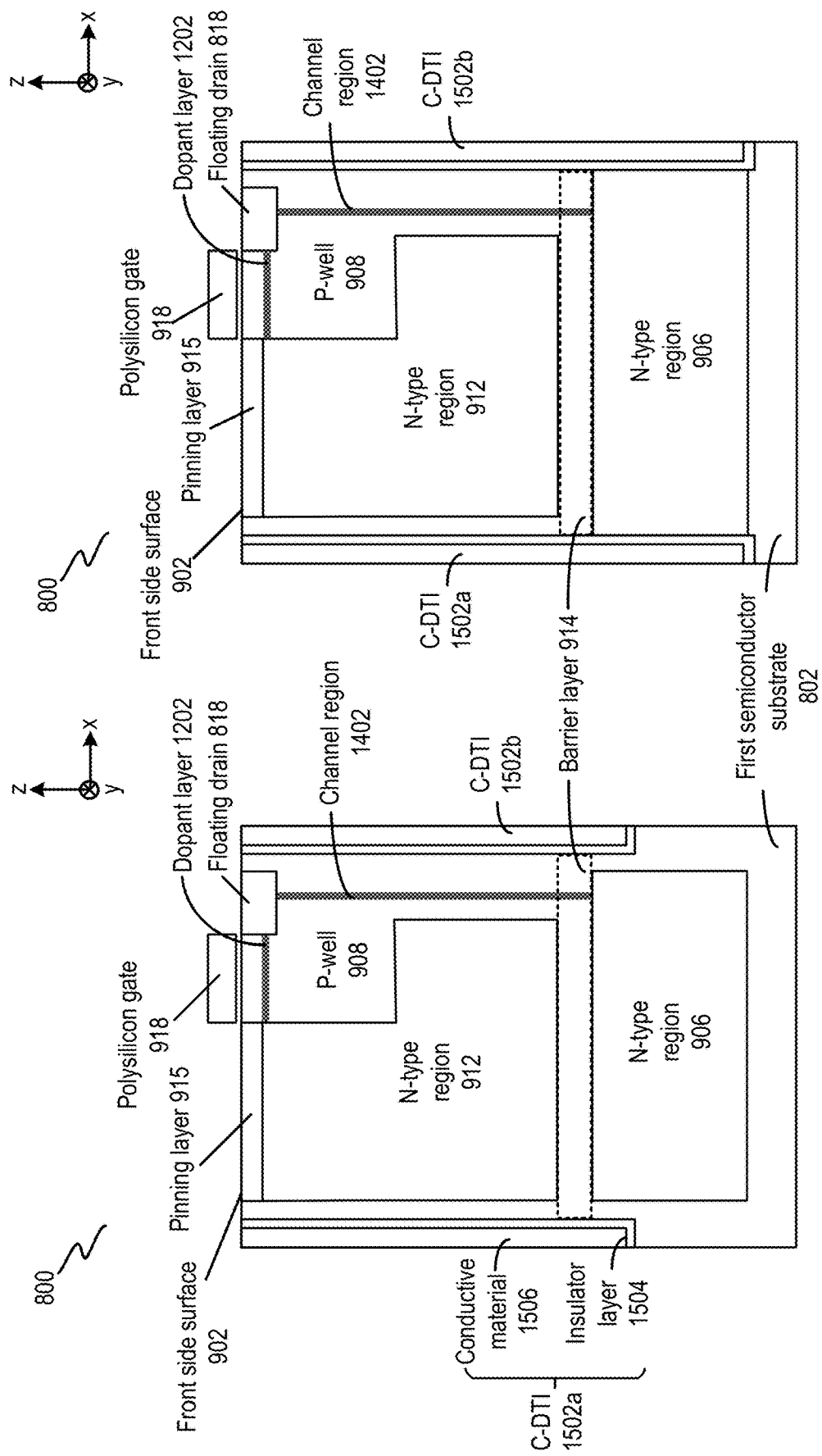
FIG. 15A and FIG. 15B illustrate additional components of the example pixel cell of FIG. 14A, FIG. 14B, FIG. 14C, and FIG. 14D.
Figure 15B:
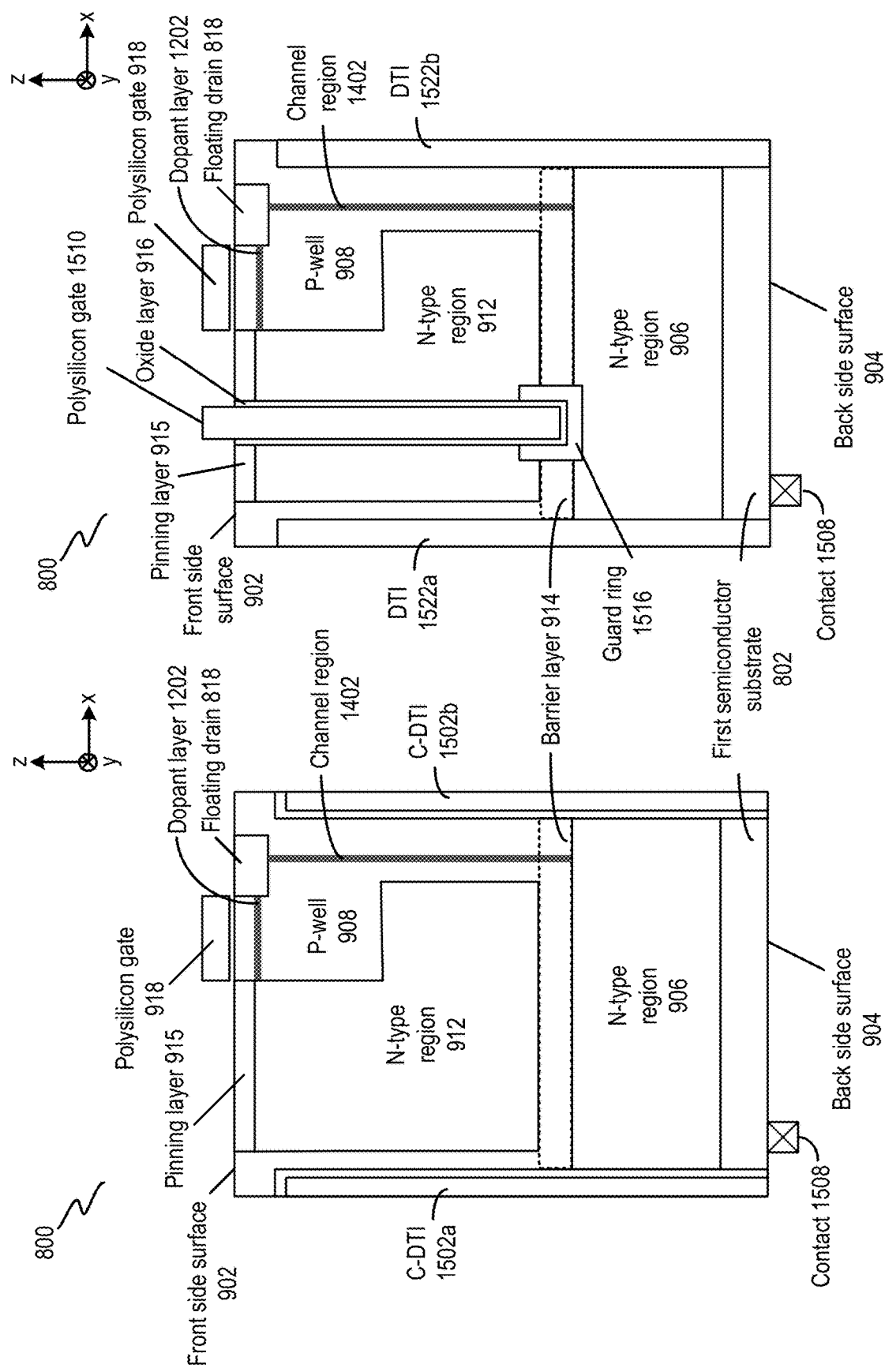

FIG. 15A and FIG. 15B illustrate examples of pixel cell 800 having channel region 1402 and components to control the electrical potential of barrier layer 914. The pixel cell 800 in FIG. 15A and FIG. 15B can be configured for as an FSI device or as a BSI device. As shown in FIG. 15A, pixel cell 800 can include conductive deep trench insulations (C-DTI) 1502a and 1502b that extend from front side surface 902 into first semiconductor substrate 802 along a vertical direction (e.g., parallel with the z-axis). The C-DTI includes an insulator layer 1504 (e.g., an oxide layer) and a conductive material 1506 (e.g., polysilicon). C-DTI 1502a and 1502b can reach the lateral sides of barrier layer 914. Each of C-DTI 1502a and 1502b can conduct a signal received from front side surface 902 to form a lateral electric field (e.g., parallel with the x/y axes) across barrier layer 914, which can push out charge from barrier layer 914 to adjust its electrical potential. C-DTI 1502a and 1502b can also provide insulation between photodiodes of adjacent pixel cells. As shown on the left of FIG. 15A, C-DTI 1502a and 1502b can reach the lateral sides of P-well 908 and N-type region 912 (of first photodiode 808) and barrier layer 914, to provide insulation for first photodiode 808, and barrier layer 914. Moreover, as shown on the right of FIG. 15A, C-DTI 1502a and 1502b can extend across barrier layer 914 and reach the lateral sides of N-type region 906, to provide insulation for second photodiode 810 as well.

FIG. 15B illustrates other examples of pixel cell 800 to control the electrical potential of barrier layer 914. As shown on the left of FIG. 15B, C-DTI 1502a and 1502b can extend from back side surface 904 to insulate first semiconductor substrate 802, N-type region 906, barrier layer 914, N-type region 912, and P-well 908. Such arrangements can further improve insulation between adjacent pixel cells. One more contact 1508 can be provided on back side surface 904 to provide access to C-DTI 1502a and 1502b as well as first semiconductor substrate 802.

In some examples, as shown on the right of FIG. 15B, pixel cell 800 can include a polysilicon gate 1510 that extends from front side surface 902 across N-type region 912 to reach barrier layer 914. Polysilicon gate 1510 is insulated from N-type region 912 and barrier layer 914 by oxide layer 916. Polysilicon gate 1510 can conduct a voltage to barrier layer 914. The voltage can assert an electrical field over oxide layer 916 to push out negative charge from barrier layer 914, which can adjust the electrical potential of barrier 914. Pixel cell 800 may further include a guard ring 1516 to insulate polysilicon gate 1510 from N-type region 906 to prevent the voltage from affecting the electrical potential of N-type region 906. Pixel cell 800 further includes DTI 1522a and 1522b to provide insulation between adjacent pixel cells. The DTI needs not be conductive, as the DTI needs not conduct an electrical field to change the electrical potential of barrier 914, which can be adjusted by polysilicon gate 1510.

Figure 16A:
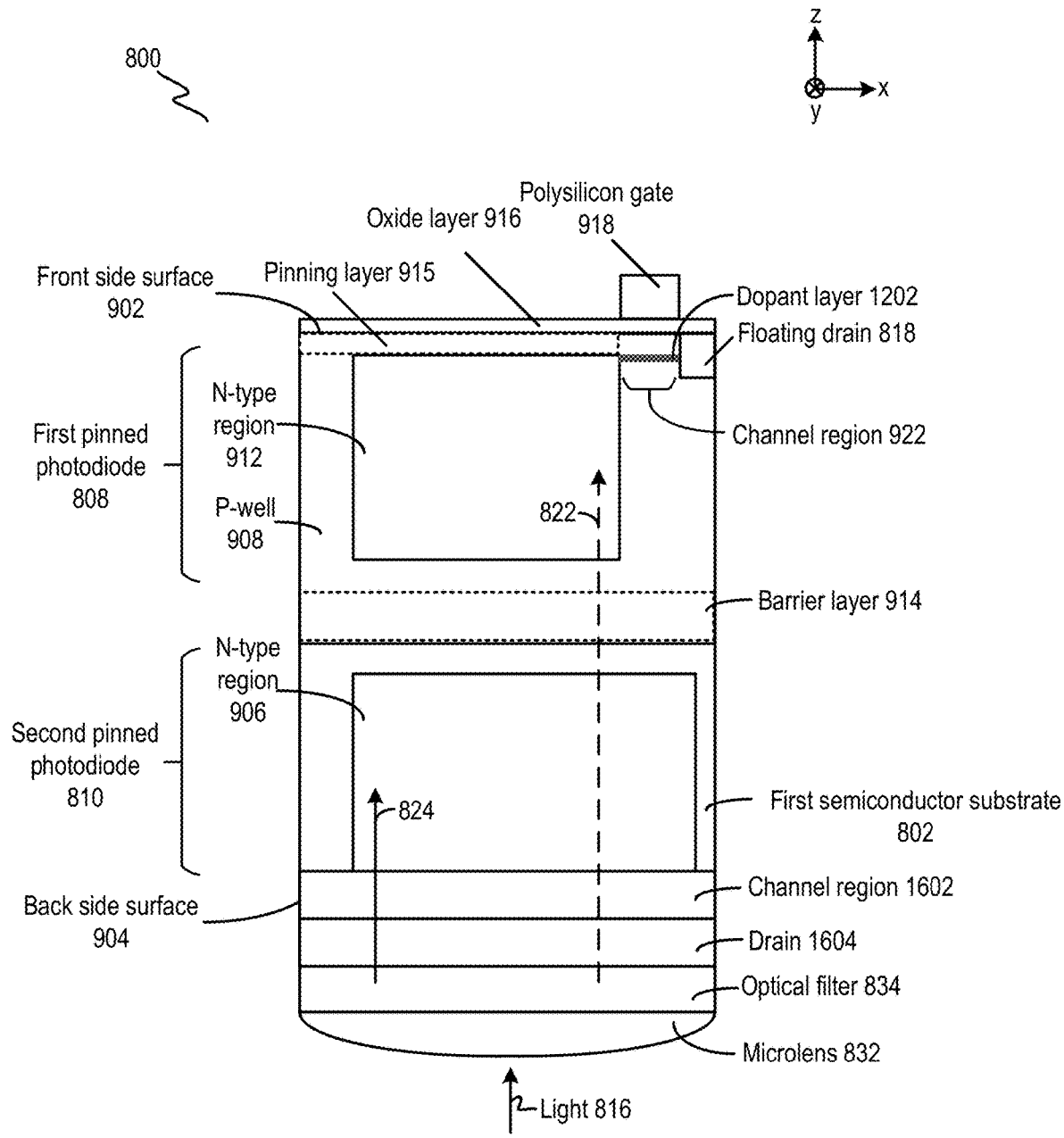
FIG. 16A, FIG. 16B, FIG. 16C, and FIG. 16D illustrate further examples of components of a pixel cell of FIG. 8 to mitigate blooming and their operations.
Figure 16B:
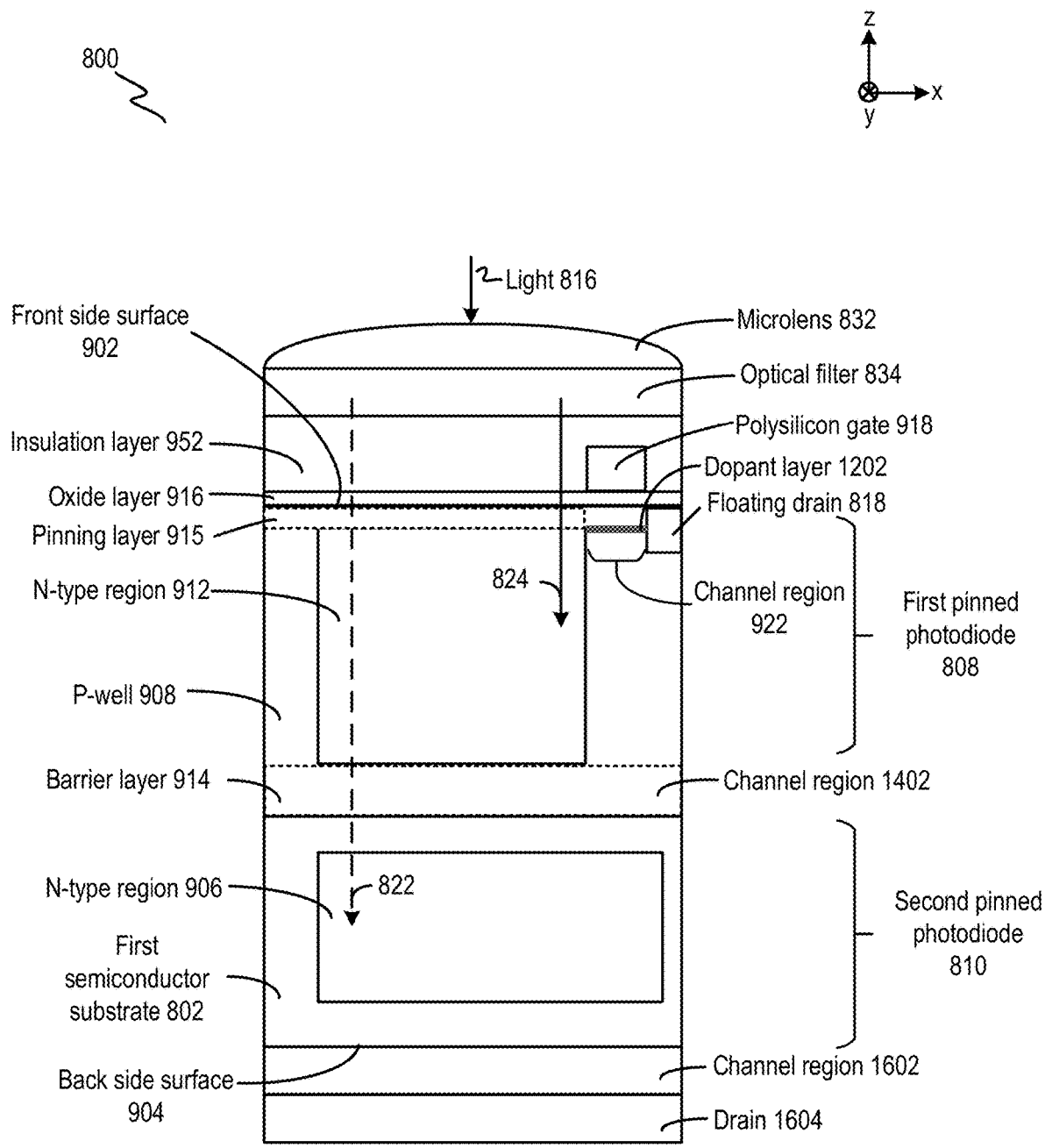
Figure 16C:
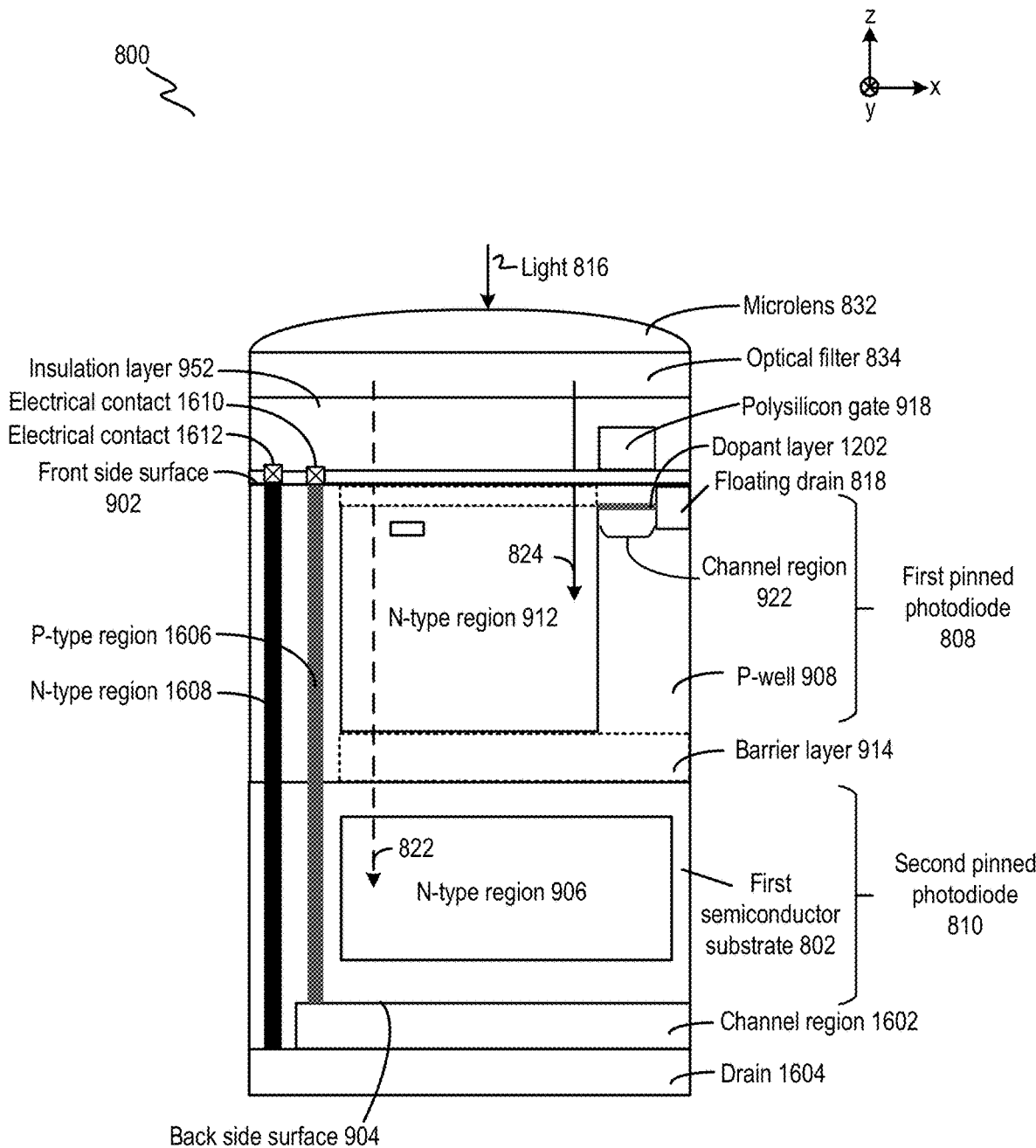

FIG. 16A and FIG. 16B illustrate additional examples of components of pixel cell 800 which can reduce or prevent blooming caused by the saturation of second photodiode 810. FIG. 16A illustrates pixel cell 800 as a BSI device, whereas FIG. 16B illustrates pixel cell 800 as an FSI device. As shown in FIG. 16A and FIG. 16B, pixel cell 800 can include a channel region 1602 formed on back side surface of 904, and a drain 1604. Channel region 1602 can be connected to a voltage source (not shown in FIG. 16A and FIG. 16B) to set an electrical potential of channel region 1602, whereas drain 1604 can be connected to a charge sink. Referring to FIG. 16C, the periphery of pixel cell 800 can include a heavily doped P-type region 1606 and a heavily doped N-type region 1608. Both P-type region 1606 and N-type region 1608 can be embedded with P-well 908 and P-type first semiconductor substrate 802 and extend from front side surface 902 and traverse pixel cell 800 along the vertical axis. P-type region 1606 can be connected to an electrical contact 1610 on front side surface 902 to provide access to channel region 1602 from front side surface 902 for connection of a bias voltage source, whereas N-type region 1608 can be connected to an electrical contact 1612 on front side surface 902 to provide access to drain 1604 from front side surface 902 for connection of a charge sink. Channel region 1602 can be biased to have a lower electrical potential difference with respect to the electrical potential of empty quantum well, $P_{empty}$, than barrier layer 914, which allows channel region 1602 to provide a lower barrier to the negative charge than barrier layer 914. As a result, channel region 1602 can conduct away the excessive charge from N-type region 906 and from barrier layer 914. Drain 1604 can be connected to a charge sink to drain away the excessive charge from channel region 1602. As a result, a vertical anti-blooming channel (e.g., parallel with the z-axis) can be formed between N-type region 906 and drain 1604. Channel region 1602 can be formed as a P-type epitaxial layer on back side surface 904, whereas drain 1604 can be formed by N-type dopants on the P-type epitaxial layer. In FIG. 16A where pixel cell 800 is configured as a BSI device, channel region 1602 and drain 1604 can be on the propagation path of light 816. The thickness of channel region 1602 and drain 1604 can be minimized to reduce absorption of second light component 824 of light 816 by channel region 1602 and drain 1604.

Figure 16D:
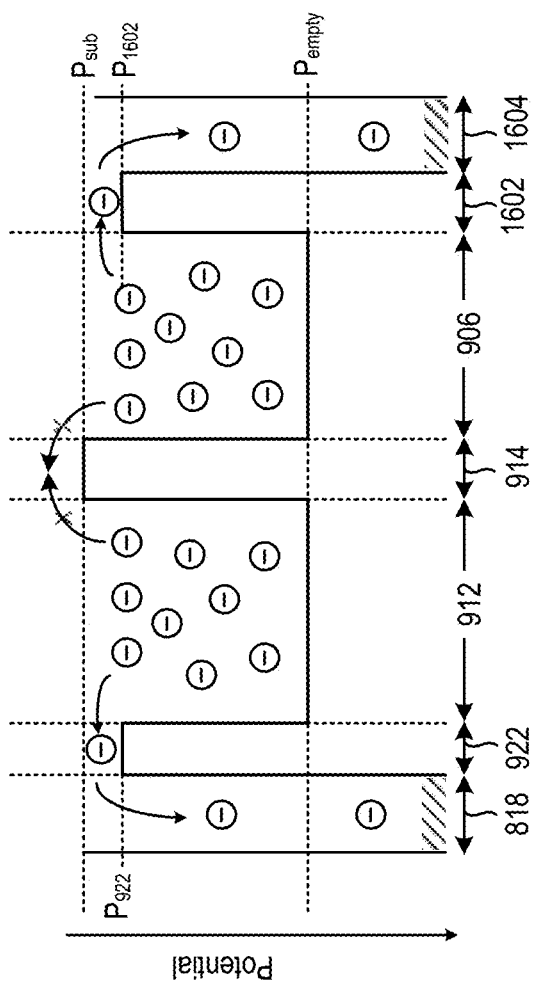

FIG. 16D illustrates example anti-blooming operations provided by channel regions 922 and 1602. As shown in FIG. 16D, the electrical potential of channel region 1602 can be set at $P_{1502}$ which is higher than $P_{sub}$ with respect to $P_{empty}$. As a result, channel region 1602 can present a lower barrier than barrier layer 914. After the electrical potential of N-type region 906 reaches $P_{1502}$ after accumulating a quantity of negative charge, additional negative charge generated at N-type region 906 can flow via channel region 1602 to drain 1604, such that the electrical potential of N-type region 906 stays at $P_{1502}$. As the electrical potential of barrier layer 914 ($P_{sub}$) remains lower than $P_{1502}$, the additional negative charge will not flow across barrier layer 914 into N-type region 912. Moreover, as described above, another antiblooming channel can be formed in channel region 922 to conduct away additional negative charge from N-type region 912 and from barrier layer 914 to floating drain 818.

Figure 17A:
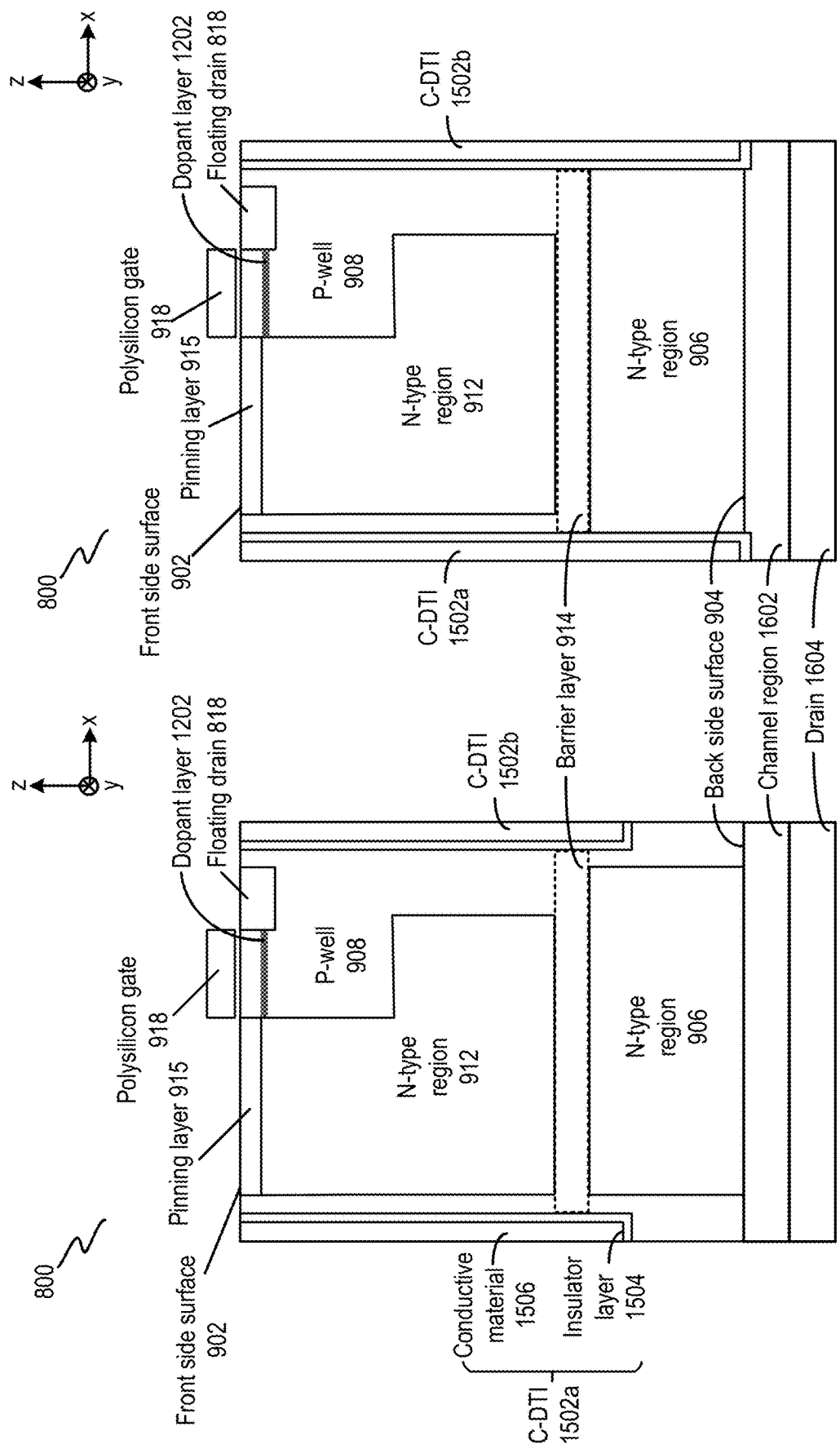
FIG. 17A and FIG. 17B illustrate additional components of the example pixel cell of FIG. 16A, FIG. 16B, FIG. 16C, and FIG. 16C.
Figure 17B:
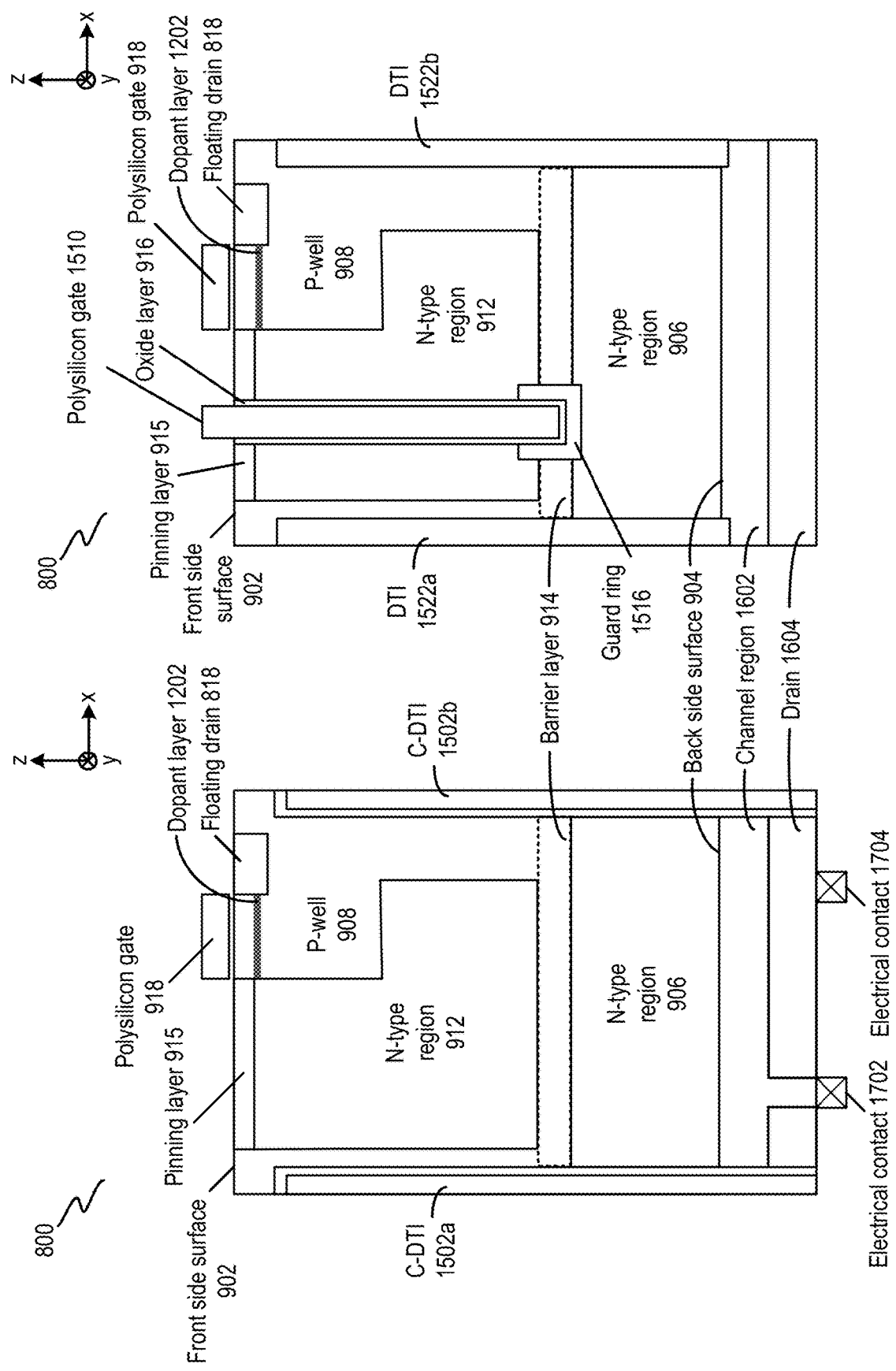

FIG. 17A and FIG. 17B illustrate examples of pixel cell 800 having channel region 1602 and drain 1604, as well as components to control the electrical potential of barrier layer 914. The components to control the electrical potential of barrier layer 914 are identical to those described in FIG. 15A and FIG. 15B, the descriptions of which are not repeated here. In FIG. 17B, electrical contacts 1702 and 1704 can be provided to provide access to, respectively, channel region 1602 and drain 1604. In FIG. 17A and FIG. 17B, channel region 1602 and drain 1604 of adjacent pixel cells can be shorted together if they are not insulated from each other by DTI or CDTI. The shorting of channel region 1602 and drain 1604 of adjacent pixel cells can further reduce the resistances of the conductive paths to the charge sink from the second photodiode 810 of each pixel cell, which can speed up the transfer of the excessive charge from the pixel cells and further improve the anti-blooming operation.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
a semiconductor substrate including:
a front side surface,
a first photodiode to generate a first charge,
a second photodiode to generate a second charge,
a barrier layer between the first photodiode and the second photodiode and configured to control flow of the second charge from the second photodiode to the first photodiode, and
a drain region to store the first charge and at least a first part of the second charge;
a gate on the front side surface over a first channel region between the first photodiode and the drain region to control the flow of the first charge and the at least first part of the second charge to the drain region; and
a second channel region to conduct at least a second part of the second charge away from the second photodiode and the barrier layer when the second photodiode saturates.

2. The apparatus of claim 1, wherein the second channel region is part of the semiconductor substrate and intersects the barrier layer.

3. The apparatus of claim 2, wherein the second channel region connects between the second photodiode and the drain region.

4. The apparatus of claim 3, wherein:
each of the drain region and the second channel region comprises an N-type semiconductor material; and
the second channel region is connected to an N-type region of the second photodiode.

5. The apparatus of claim 4, wherein the semiconductor substrate further comprises a P-well that surrounds the N-type region of the second photodiode; and
wherein the N-type second channel region is formed in the P-well.

6. The apparatus of claim 4, wherein a first dopant concentration of the second channel region is lower than a second dopant concentration of the N-type region of the second photodiode.

7. The apparatus of claim 3, wherein:
the drain region is a first drain region;
the semiconductor substrate further comprises a second drain region; and
the second channel region connects between the second photodiode and the second drain region.

8. The apparatus of claim 1, wherein the second channel region is formed by an ion implantation process.

9. The apparatus of claim 1, wherein the second photodiode is sandwiched between the barrier layer and the second channel region.

10. The apparatus of claim 9, wherein:
the drain region is a first drain region;
the semiconductor substrate further comprises a second drain region; and
the second channel region is sandwiched between the second photodiode and the second drain region.

11. The apparatus of claim 10, wherein the second channel region comprises an epitaxy layer formed on a back side surface of the semiconductor substrate, the back side surface being opposite to the front side surface of the semiconductor substrate.

12. The apparatus of claim 10, wherein:
the semiconductor substrate further comprises a first conductive region and a second conductive region extending from the front side surface configured to receive, respectively, a first voltage and a second voltage;
the first conductive region extends from the front side surface to the second channel region and is configured to bias the second channel region at the first voltage; and
the second conductive region extends from the front side surface to the second drain region and is configured to bias the second drain region at the second voltage.

13. The apparatus of claim 10, wherein the second channel region comprises a P-type semiconductor material; and
wherein the second drain region comprises an N-type semiconductor material.

14. The apparatus of claim 1, wherein:
the semiconductor substrate includes a back side surface opposite to the front side surface configured as a light receiving surface;
the first photodiode is configured to convert a first component of light within an infra-red light wavelength range to the first charge; and
the second photodiode is configured to convert a second component of light within a visible light wavelength range to the second charge.

15. The apparatus of claim 1, wherein:
the front side surface is configured as a light receiving surface;
the first photodiode is configured to convert a first component of light within a visible light wavelength range to the first charge; and
the second photodiode is configured to convert a second component of light within an infra-red light wavelength range to the second charge.

16. The apparatus of claim 1, wherein the first channel region comprises a buried layer.

17. The apparatus of claim 16, further comprising a conductive deep trench isolation (C-DTI) structure that extends from the front side surface and across an N-type region of the first photodiode and the barrier layer; and
wherein the C-DTI structure is configured to receive a voltage and to bias the barrier layer based on the voltage.

18. The apparatus of claim 17, wherein the C-DTI structure extends across the an N-type region of the second photodiode.

19. The apparatus of claim 1, further comprising:
a back side surface opposite to the front side surface; and
a C-DTI structure that extends from the back side surface and across an N-type region of the second photodiode and the barrier layer,
wherein the C-DTI structure is configured to receive a voltage signal and to bias the barrier layer based on the voltage signal.

20. The apparatus of claim 1, wherein:
the gate is a first gate;
the apparatus further comprises a second gate that extends from the front side surface to reach the barrier layer; and
the second gate is configured to receive a voltage signal and to bias the barrier layer based on the voltage signal.

* * * * *